(12) United States Patent
Miyazawa et al.

(10) Patent No.: US 7,545,357 B2
(45) Date of Patent: *Jun. 9, 2009

(54) DISPLAY DEVICE HAVING AN IMPROVED VOLTAGE LEVEL CONVERTER CIRCUIT

(75) Inventors: Toshio Miyazawa, Chiba (JP); Hideo Satou, Mobara (JP); Tomohiko Satou, Chiba (JP); Masahiro Maki, Mobara (JP)

(73) Assignees: Hitachi, Ltd., Tokyo (JP); Hitachi Device Engineering Co., Ltd., Mobara-shi (JP)

( * ) Notice: Subject to any disclaimer, the term of this patent is extended or adjusted under 35 U.S.C. 154(b) by 598 days.

This patent is subject to a terminal disclaimer.

(21) Appl. No.: 11/203,971

(22) Filed: Aug. 16, 2005

(65) Prior Publication Data

US 2006/0071895 A1 Apr. 6, 2006

Related U.S. Application Data

(63) Continuation of application No. 10/730,108, filed on Dec. 9, 2003, now Pat. No. 6,930,666, which is a continuation of application No. 09/988,209, filed on Nov. 19, 2001, now Pat. No. 6,686,899.

(30) Foreign Application Priority Data

Nov. 22, 2000 (JP) ............................... 2000-355598

(51) Int. Cl.
G09G 3/36 (2006.01)
H03L 5/00 (2006.01)
H03K 19/0175 (2006.01)

(52) U.S. Cl. ........................ 345/100; 345/92; 345/99; 327/333; 326/81

(58) Field of Classification Search ............. 326/62–68, 326/75, 80, 81; 327/333, 391; 345/90, 92, 345/98–100, 205, 206, 213
See application file for complete search history.

(56) References Cited

U.S. PATENT DOCUMENTS 5,650,742 A 7/1997 Hirano (Continued)

FOREIGN PATENT DOCUMENTS

CN 1202764 A 12/1998

(Continued)

*Primary Examiner*—Srilakshmi K Kumar
(74) *Attorney, Agent, or Firm*—Antonelli, Terry, Stout & Kraus, LLP.

(57) ABSTRACT

A display device has a driver including a level converter formed of polysilicon MISTFTs. The level converter includes first, second and third N-channel MISTFTs (NMISTFTS) and first, second and third P-channel MISTFTs (PMISTFTS). Gate and first terminals of the first NMISTFT and PMISTFT, and a gate terminal of the third PMISTFT are coupled to an input terminal via a capacitance. Second terminals of the second NMISTFT and PMISTFT, and a gate terminal of third NMISTFT are coupled to the input terminal via a capacitance. A first terminal of the third PMISTFT, and second terminals of the first NMISTFT and PMISTFT are coupled to a high voltage. A second terminal of the third NMISTFT, gate and first terminals of the second NMISTFT and PMISTFT are coupled to a low voltage. A second terminal of the third PMISTFT and a first terminal of the third NMISTFT are connected to an output terminal.

9 Claims, 21 Drawing Sheets

U.S. PATENT DOCUMENTS

| | | |
|---|---|---|
| 5,694,061 A | 12/1997 | Morosawa et al. |
| 5,973,508 A | 10/1999 | Nowak et al. |
| 6,066,975 A | 5/2000 | Matano |
| 6,107,830 A | 8/2000 | Okumura |
| 6,262,598 B1 | 7/2001 | Cairns et al. |
| 6,307,236 B1 | 10/2001 | Matsuzaki et al. |
| 6,320,414 B1 | 11/2001 | Annema et al. |
| 6,580,411 B1 | 6/2003 | Kubota et al. |
| 6,686,899 B2 * | 2/2004 | Miyazawa et al. .......... 345/100 |
| 6,930,666 B2 * | 8/2005 | Miyazawa et al. .......... 345/100 |

FOREIGN PATENT DOCUMENTS

| | | |
|---|---|---|
| JP | 58-29200 | 2/1983 |
| JP | 9-246936 | 9/1997 |
| JP | 11-502355 | 2/1999 |
| WO | WO 97/25716 | 7/1997 |

* cited by examiner

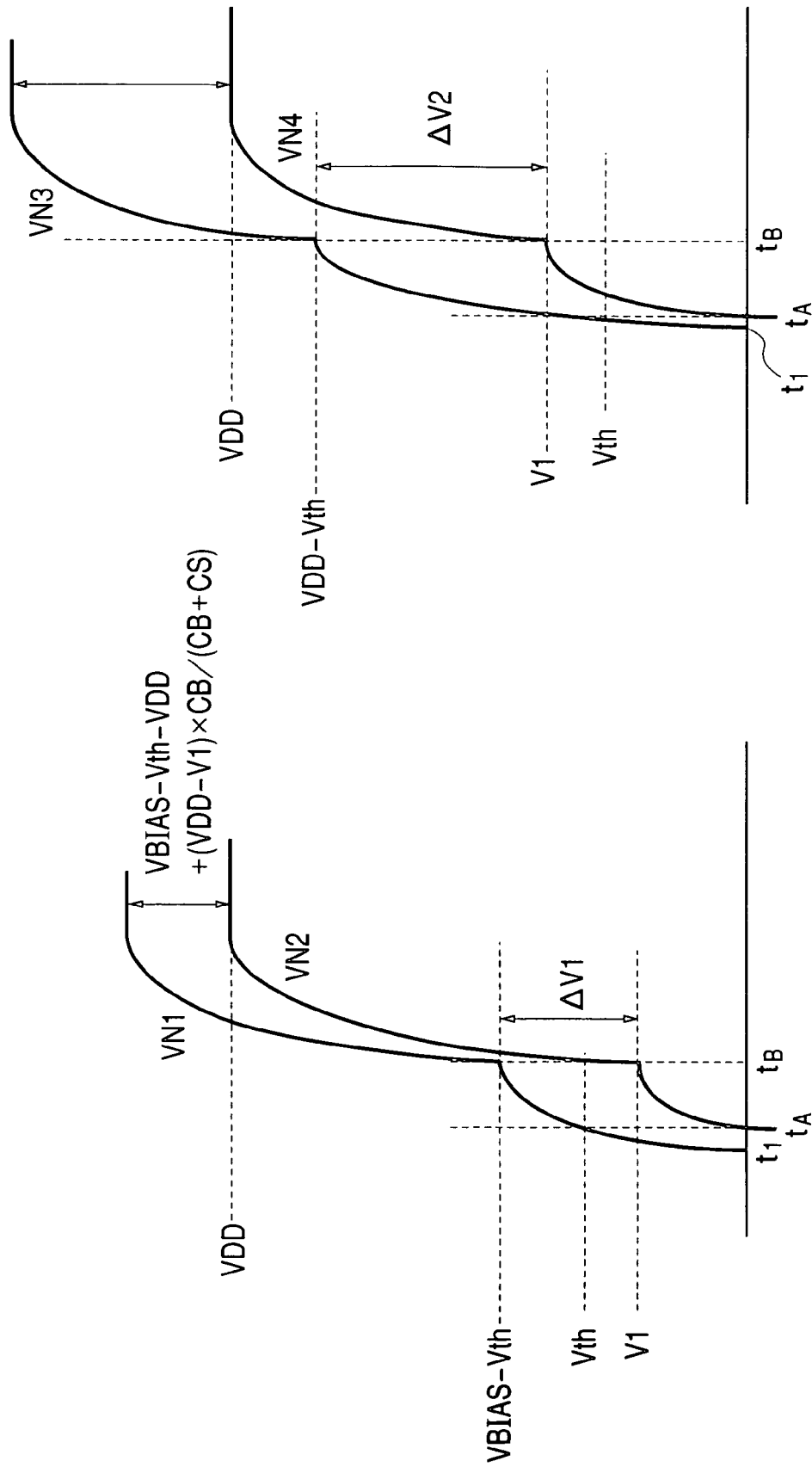

DISPLAY DEVICE HAVING AN IMPROVED VOLTAGE LEVEL CONVERTER CIRCUIT

CROSS-REFERENCE TO RELATED APPLICATION

This is a Continuation of application Ser. No. 10/730,108, filed Dec. 9, 2003, now U.S. Pat. No. 6,930,666 which is a Continuation of Application Ser. No. 09/988,209, filed Nov. 19, 2001, (now U.S. Pat. No. 6,686,899), the entire disclosure of which are hereby incorporated by reference.

BACKGROUND OF THE INVENTION

The present invention relates to a display device, and in particular to an active matrix type display device having a driver circuit for driving pixels, fabricated on its substrate of its display panel.

A display panel has an electrooptical material layer sandwiched between a pair of substrates. In this specification, the term "electrooptical material" refers to material which changes its optical properties such as transmission, emission, refractive index and absorption of light under the influence of an electric field or current. The electrooptical material includes liquid crystal material and electroluminescent material, for example.

By way of example, an active matrix type liquid crystal display device shall be considered.

In the active matrix type liquid crystal display device, each pixel area is surrounded by two adjacent ones of a plurality of gate signal lines extending in the x direction and arranged in the y direction and two adjacent ones of a plurality of drain signal lines extending in the y direction and arranged in the x direction which are fabricated on a liquid-crystal-layer-side surface of one of a pair of substrates sandwiching a liquid crystal layer. Each pixel area is provided with a thin film transistor operated by a scanning signal supplied from one of the gate signal lines and a pixel electrode supplied with a video signal from one of the drain signal lines via the thin film transistor.

The pixel electrode generates an electric field between it and a counter electrode fabricated on the other of the pair of substrates, for example, so that the electric field control the light transmission through the liquid crystal layer between the two electrodes. The liquid crystal display device is provided with a scanning signal driving circuit for supplying a scanning signal to each of the gate signal lines and a video signal line driving circuit for supplying a video signal to each of the drain signal lines.

These scanning signal driving circuit and video signal line driving circuit are formed of a large number of MIS (Metal Insulator Semiconductor) transistors having configurations similar to thin film transistors fabricated in the pixel areas, and therefore a technique is known in which semiconductor layers of the thin film transistors in the pixel areas are made of polycrystalline silicon (p-Si), and the scanning signal driving circuit and the video signal line driving circuit are fabricated on the one of the pair of substrates simultaneously with the pixels. These circuits are composed of transistors made of polycrystalline silicon, therefore their output signal levels are low, and consequently, their output signal themselves are sometimes insufficient for driving the pixels. To solve this problem, voltage level converters are incorporated into the liquid crystal display devices for converting voltages such as pulses from a low level to a higher level. Generally, the voltage level converters as shown in FIG. 16 or FIG. 17, for example.

SUMMARY OF THE INVENTION

The basic operating principle of the above-mentioned voltage level converters is that ON-OFF of a current in one of a pair of MOS transistors of the opposite conductivity types is controlled by an external input pulse, and by using a resultant change in voltage, ON-OFF of a current in the other of the pair of MOS transistors is controlled so as to provide a pulse having an amplitude greater than that of the external input pulse. As a result, ON-OFF of the current in the other of the pair of MOS transistors is controlled by using as an input a large voltage change close to an amplitude of the level-converted voltage. Consequently, some current (hereinafter the through current) flows through the pair of MOS transistors before the voltage for controlling ON-OFF of the current in the other of the pair of MOS transistors reaches a voltage sufficient to control the ON-Off of the current.

When the voltage level converter is composed of polysilicon MOS transistors, it has been pointed out that its current supply capability is decreased further when it is gate-controlled with an external small-voltage input pulse because charge-carrier mobility in the polysilicon MOS transistors is smaller than that in single-crystal MOS transistors, therefore a time is increased which is required for a voltage to reach a value sufficient to control ON-OFF of a current of the MOS transistor, and as a result the above-explained through current is increased.

The present invention has been made so as to solve the above problems, and it is an object of the present invention to provide a display device having a voltage level converter with the above-explained through current sufficiently suppressed.

The following explains the representative ones of the present inventions briefly.

In accordance with an embodiment of the present invention, there is provided a display device including a pair of substrates, an electrooptical material layer sandwiched between the pair of substrates, a plurality of pixels formed between the pair of substrates and a driver circuit for driving the plurality of pixels provided on one of the pair of substrates, the driver circuit including a level converter circuit comprised of MISTFTs (Metal Insulator Semiconductor Thin Film Transistors) having semiconductor layers made of polysilicon, the level converter circuit comprising: a pair of a first NMISTFT (N-channel type Metal Insulator Semiconductor Thin Film Transistor) and a first PMISTFT (P-channel type Metal Insulator Semiconductor Thin Film Transistor), each of the first NMISTFT and the first PMISTFT having both a gate terminal thereof and a first terminal thereof coupled to an input terminal for receiving an input pulse via a first capacitance; a pair of a second NMISTFT and a second PMISTFT, each of the second NMISTFT and the second PMISTFT having a second terminal thereof coupled to the input terminal via a second capacitance; a third PMISTFT having a gate terminal thereof coupled to the gate terminals and the first terminals of the first NMISTFT and the first PMISTFT; a third NMISTFT having a gate terminal thereof coupled to the second terminals of the second NMISTFT and the second PMISTFT, a first terminal of the third PMISTFT, a second terminal of the first NMISTFT, and a second terminal of the first PMISTFT being coupled to a high-voltage power supply line, a second terminal of the third NMISTFT, a gate terminal and a first terminal of the second NMISTFT, a gate terminal and a first terminal of the second PMISTFT being coupled to a low-voltage power supply line, and a first junction point between a second terminal of the third PMISTFT and a first terminal of the third NMISTFT being connected to an output terminal of the level converter circuit.

In accordance with another embodiment of the present invention, there is provided a display device including a pair of substrates, an electrooptical material layer sandwiched between the pair of substrates, a plurality of pixels formed between the pair of substrates and a driver circuit for driving the plurality of pixels provided on one of the pair of substrates, the driver circuit including a level converter circuit comprised of MISTFTs (Metal Insulator Semiconductor Thin Film Transistors) having semiconductor layers made of polysilicon, the level converter circuit having a plurality of stages arranged in series, each of the plurality of stages comprising: a pair of a first NMISTFT (N-channel type Metal Insulator Semiconductor Thin Film Transistor) and a first PMISTFT (P-channel type Metal Insulator Semiconductor Thin Film Transistor), each of the first NMISTFT and the first PMISTFT having both a gate terminal thereof and a first terminal thereof coupled to an input terminal for receiving an input pulse via a first capacitance; a pair of a second NMISTFT and a second PMISTFT, each of the second NMISTFT and the second PMISTFT having a second terminal thereof coupled to the input terminal via a second capacitance; a third PMISTFT having a gate terminal thereof coupled to the gate terminals and the first terminals of the first NMISTFT and the first PMISTFT; a third NMISTFT having a gate terminal thereof coupled to the second terminals of the second NMISTFT and the second PMISTFT, a first terminal of the third PMISTFT, a second terminal of the first NMISTFT, and a second terminal of the first PMISTFT being coupled to a high-voltage power supply line, a second terminal of the third NMISTFT, a gate terminal and a first terminal of the second NMISTFT, a gate terminal and a first terminal of the second PMISTFT being coupled to a low-voltage power supply line, and a first junction point between a second terminal of the third PMISTFT and a first terminal of the third NMISTFT being connected to an output terminal.

In accordance with another embodiment of the present invention, there is provided a display device including a pair of substrates, an electrooptical material layer sandwiched between the pair of substrates, a plurality of pixels formed between the pair of substrates and a driver circuit for driving the plurality of pixels provided on one of the pair of substrates, the driver circuit including a level converter circuit comprised of MISTFTs (Metal Insulator Semiconductor Thin Film Transistors) of a same conductivity type and having semiconductor layers made of polysilicon, the level converter circuit comprising a first MISTFT, a second MISTFT, and a third MISTFT, first terminals of the first MISTFT and the second MISTFT being coupled to an input terminal for receiving an input pulse, gate terminals of the first MISTFT and the second MISTFT being coupled to a fixed-voltage power supply line, a second terminal of the first MISTFT being coupled to a gate terminal of the third MISTFT and a first terminal of a capacitor, a second terminal of the third MISTFT being coupled to a high-voltage power supply line, a first terminal of the third MISTFT being coupled to a second terminal of the second MISTFT, and a junction point of the second terminal of the second MISTFT, the first terminal of the third MISTFT, and a second terminal of the capacitor being connected to an output terminal of the level converter circuit.

In accordance with another embodiment of the present invention, there is provided a display device including a pair of substrates, an electrooptical material layer sandwiched between the pair of substrates, a plurality of pixels formed between the pair of substrates and a driver circuit for driving the plurality of pixels provided on one of the pair of substrates, the driver circuit including a level converter circuit comprised of MISTFTs (Metal Insulator Semiconductor Thin Film Transistors) of a same conductivity type and having semiconductor layers made of polysilicon, the level converter circuit comprising a first MISTFT, a second MISTFT, and a third MISTFT, first terminals of the first MISTFT and the second MISTFT being coupled to an input terminal for receiving an input pulse, a gate terminal of the first MISTFT being coupled to a fixed-voltage power supply line, a gate terminal of the second MISTFT being supplied with a pulse equal in magnitude and opposite in phase with respect to the input pulse, a second terminal of the first MISTFT being coupled to a gate terminal of the third MISTFT and a first terminal of a capacitor, a first terminal of the third MISTFT being coupled to a high-voltage power supply line, and a junction point of a second terminal of the second MISTFT, a second terminal of the third MISTFT, and a second terminal of the capacitor being connected to an output terminal of the level converter circuit.

In accordance with another embodiment of the present invention, there is provided a display device including a pair of substrates, an electrooptical material layer sandwiched between the pair of substrates, a plurality of pixels formed between the pair of substrates and a driver circuit for driving the plurality of pixels provided on one of the pair of substrates, the driver circuit including a level converter circuit comprised of MISTFTs (Metal Insulator Semiconductor Thin Film Transistors) of a same conductivity type and having semiconductor layers made of polysilicon, the level converter circuit having a plurality of stages arranged in series, each of the plurality of stages comprising: a first MISTFT, a second MISTFT, and a third MISTFT, first terminals of the first MISTFT and the second MISTFT being coupled to an input terminal for receiving an input pulse, a gate terminal of the first MISTFT being coupled to a fixed-voltage power supply line, a gate terminal of the second MISTFT being supplied with a pulse equal in magnitude and opposite in phase with respect to the input pulse, a second terminal of the first MISTFT being coupled to a gate terminal of the third MISTFT and a first terminal of a capacitor, a first terminal of the third MISTFT being coupled to a high-voltage power supply line, and a junction point of a second terminal of the second MISTFT, a second terminal of the third MISTFT, and a second terminal of the capacitor being connected to an output terminal.

BRIEF DESCRIPTION OF THE DRAWINGS

In the accompanying drawings, in which like reference numerals designate similar components throughout the figures, and in which:

FIG. 13C illustrates changes of the potentials at the nodes N1 and N2 of FIG. 13A in greater detail, and FIG. 13D illustrates changes of the potentials at the nodes N3 and N4 of FIG. 13A in greater detail;

DETAILED DESCRIPTION OF THE PREFERRED EMBODIMENTS

The embodiments of the display device in accordance with the present invention will be explained in detail by reference to the drawings.

For the sake of being specific, we shall assume throughout this specification that a liquid crystal material layer is used as an electrooptical material layer in the display device. It is needless to say that an electrooptical material layer other than the liquid crystal material layer, an electroluminescent material layer, for example, can be used instead in the following embodiments.

Embodiment 1

Overall Configuration

Figure 2:
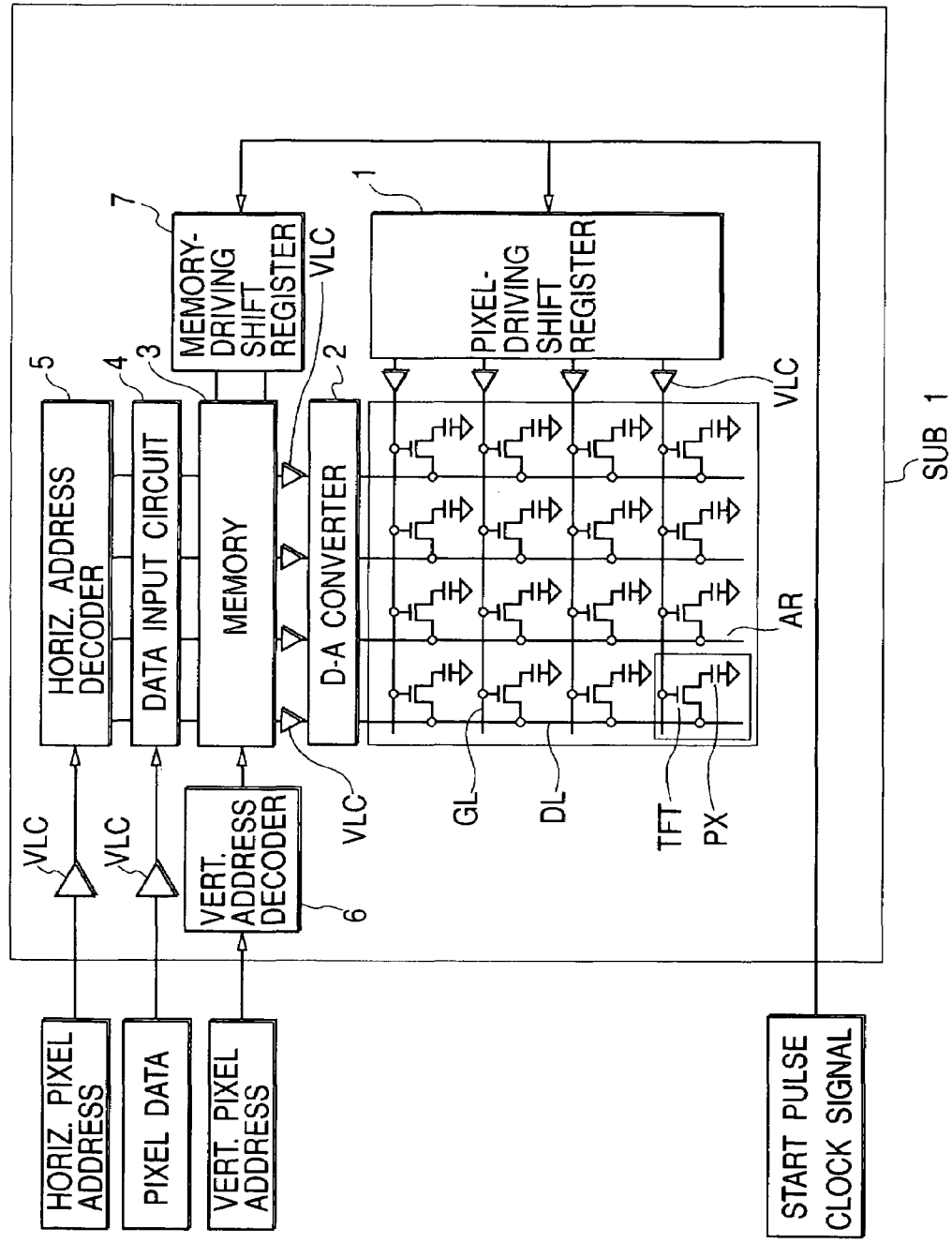
FIG. 2 is an equivalent circuit diagram of an overall configuration of an embodiment of the liquid crystal display device in accordance with the present invention.

FIG. 2 is a schematic illustration of an overall configuration of the liquid crystal display device in accordance with the present invention, and is a plan view representing an actual geometrical arrangement of the components of the liquid crystal display device.

FIG. 2 depicts a transparent substrate SUB1 made of glass, for example, which is one of a pair of opposing transparent substrates sandwiching a liquid crystal layer. In a central area (a display area AR) on a liquid-crystal-layer-side surface of the transparent substrate SUB1, excluding its periphery, there are a plurality of gate signal lines GL extending in the x direction and arranged in the y direction and a plurality of drain signal lines DL extending in the y direction and arranged in the x direction.

Each pixel area is formed by an area surrounded by two adjacent gate signal lines GL and two adjacent drain signal lines DL. Each pixel area is provided with a thin film transistor TFT operated by a scanning signal supplied from one of the two gate signal lines GL and a pixel electrode PX supplied with a video signal from one of the drain signal lines DL via the thin film transistor TFT.

Scanning signals (voltage signals) are supplied to the gate signal lines GL sequentially in the order from the top to the bottom in FIG. 2, and the thin film transistors TFT are turned ON by the scanning signals. In synchronism with this, the pixel electrodes PX are supplied with video signals (voltage signals) from the corresponding drain signal lines DL via the corresponding thin film transistors TFT in the ON state.

Each of the pixel electrodes PX generates an electric field between it and a counter electrode (not shown) for all the pixel areas in common on a liquid-crystal-layer-side surface of the other transparent substrates opposing the transparent substrate SUB1, for example, so that the electric field control the light transmission through the liquid crystal layer.

Each of the gate signal lines GL is connected at one end thereof (at the right-hand side of FIG. 2) to a pixel-driving shift register 1, which supplies scanning signals sequentially to the gate signal lines GL. Each of the drain signal lines DL is connected at one end thereof to a D-A converter circuit 2, a memory 3, a data input circuit 4, and a horizontal address decoder 5 in this order (toward the top side of FIG. 2). Connected to the memory 3 are a vertical address decoder 6 and a memory-driving shift register 7.

Supplied to the liquid crystal display device of this configuration is information including a start pulse clock signal, pixel data, horizontal pixel addresses, and vertical pixel addresses. The start pulse clock signal is supplied to the memory-driving shift register 7 and the pixel-driving shift register 1, the horizontal pixel addresses are supplied to the horizontal address decoder 5, the pixel data are supplied to the data input circuit 4, and the vertical pixel addresses are supplied to the vertical address decoder 6.

In the above circuit configuration, the voltage level converters VLC are employed at positions requiring level conversion of a voltage. In FIG. 2, the voltage level converters VLC are added in series with the input of the horizontal address decoder 5 for receiving horizontal pixel addresses, in series with the input of the data input circuit 4 for receiving pixel data, between the memory 3 and the D-A converter circuit 2, and between the pixel-driving shift register 1 and the gate signal lines GL.

In the display area AR and the circuits at its periphery fabricated on the surface of the transparent substrate SUB1, by using a photolithographic technique, laminations of conductive layers, semiconductor layers and insulating layers selectively etched in specified patterns form thin film transistors (metal insulator semiconductor thin film transistors, hereinafter MISTFTs), and pixel electrodes, signal lines and others etched in specified patterns are disposed. The semiconductor layers are made of polycrystalline silicon (p-Si), for example.

Level Converter Circuit

Figure 1A:
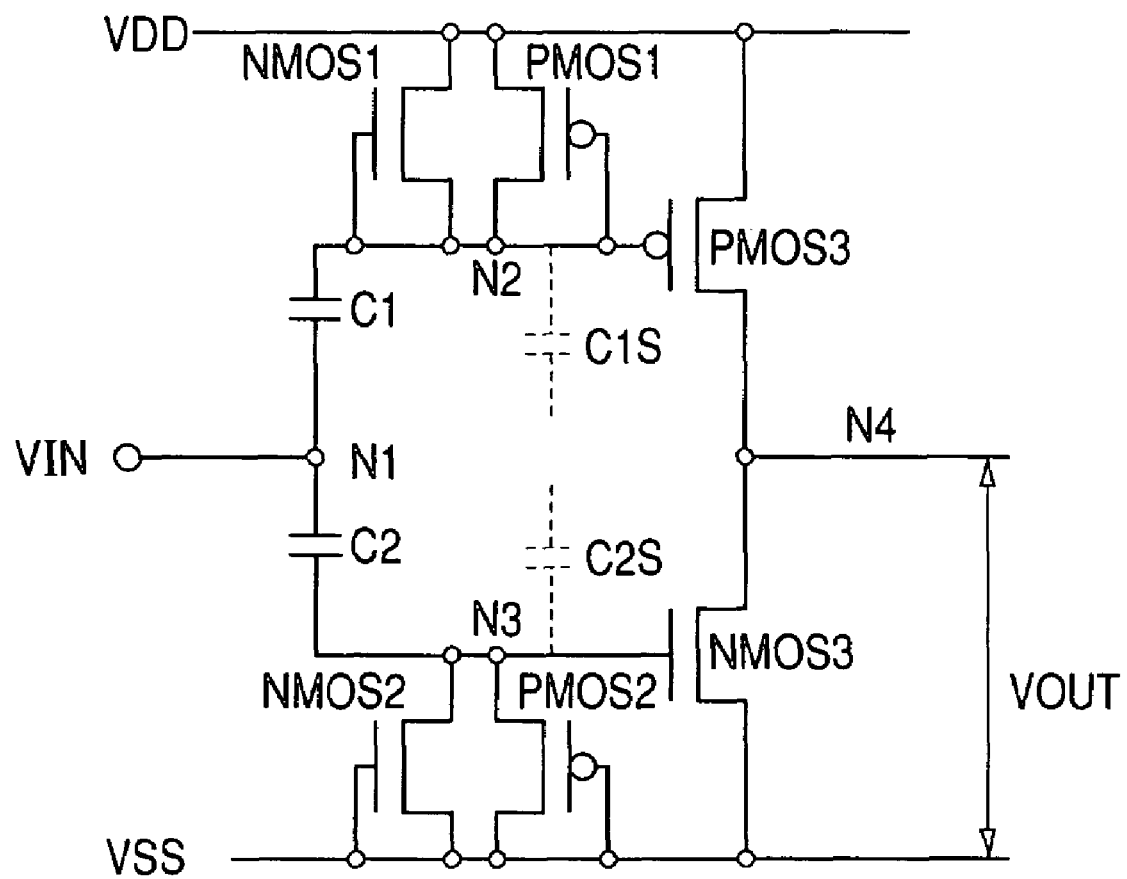
FIG. 1A is a circuit diagram of an embodiment of a voltage level converter fabricated in the liquid crystal display device in accordance with the present invention.

FIG. 1A is a circuit diagram of an embodiment of the level converter VLC. It is not necessary to employ the level converter VLC at all of the positions indicated in FIG. 2, but the level converters VLC may be employed at positions requiring them or other positions.

In FIG. 1A, an input terminal for receiving an input pulse VIN is coupled to a gate terminal and a first terminal (one of a source terminal and a drain terminal) of an n-channel type MOS transistor NMOS1 and to a gate terminal and a first terminal (one of a source terminal and a drain terminal) of a p-channel type MOS transistor PMOS1, via a first capacitance C1. Also the input terminal for receiving the input pulse VIN is coupled to a second terminal (the other of the source terminal and the drain terminal) of an n-channel type MOS transistor NMOS2 and a second terminal (the other of the source terminal and the drain terminal) of a p-channel type MOS transistor PMOS2, via a second capacitance C2.

The gate terminals and the first terminals of both the n-channel type MOS transistor NMOS1 and the p-channel type MOS transistor PMOS1 are coupled to a gate terminal of the p-channel type MOS transistor PMOS3. The second terminals of both the n-channel type MOS transistor NMOS2 and the p-channel type MOS transistor PMOS2 are coupled to a gate terminal of an n-channel type MOS transistor NMOS3. Second terminals of both the n-channel type MOS transistor NMOS1 and the p-channel type MOS transistor PMOS1, and a first terminal of the p-channel type MOS transistor PMOS3 are coupled to a high-voltage power supply line VDD.

Gate terminals and first terminals of both the n-channel type MOS transistor NMOS2 and the p-channel type MOS transistor PMOS2, and a second terminal of an n-channel type MOS transistor NMOS3 are coupled to a low-voltage power supply line VSS.

Reference characters VDD and VSS will be hereinafter used not only to designate the lines but also to specify the voltages on the lines.

The p-channel type MOS transistor PMOS3 and the n-channel type MOS transistor NMOS3 form a complementary MOS transistor (CMOS), and a junction point between a second terminal of the p-channel type MOS transistor PMOS3 and a first terminal of the n-channel type MOS transistor NMOS3 forms an output terminal.

Figure 1B:
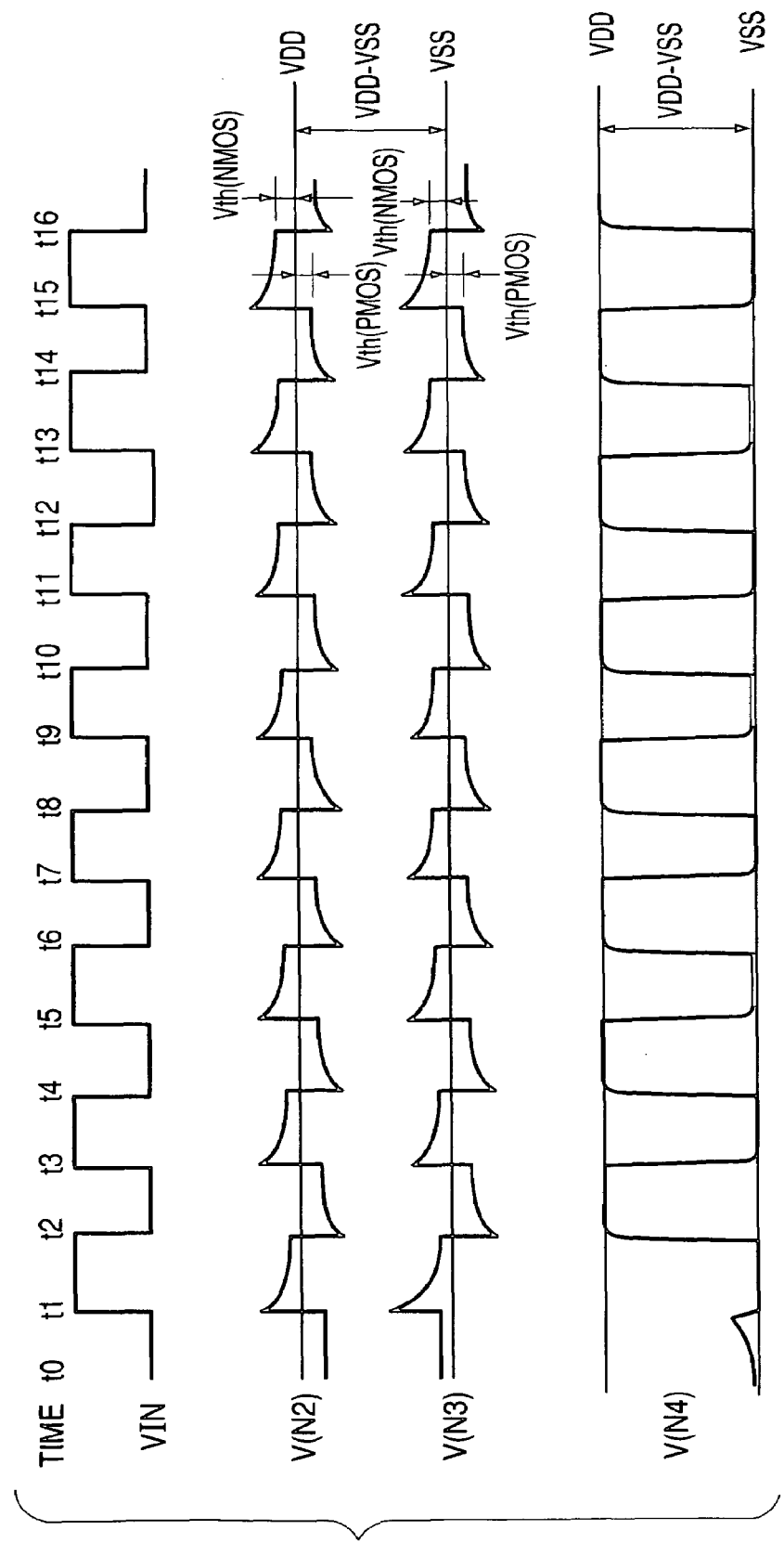
FIG. 1B illustrates waveforms of an input pulse and signals at three nodes in the voltage level converter of FIG. 1A.

The following explains the operation of the voltage level converter VLC of the above configuration. FIG. 1B illustrates waveforms of the input pulse VIN and signals at nodes N2 to N4 indicated in FIG. 1A. The input pulse VIN is capacitively coupled to the nodes N2 and N3 via capacitances C1 and C2, respectively, and voltage changes $\pm \Delta V$ in the input pulse VIN cause voltage changes $\pm \Delta V(N2)$ and $\pm \Delta V(N3)$ at the nodes N2 and N3, respectively. The voltage changes $\pm \Delta V(N2)$ and $\pm \Delta V(N3)$ are approximately represented by the following equations (1) and (2), respectively:

$$\Delta V(N2) = C1 \times \Delta V/(C1+C1S) \quad (1)$$

$$\Delta V(N3) = C2 \times \Delta V/(C2+C2S) \quad (2),$$

where C1S and C2S are so-called parasitic capacitances formed at the nodes N2 and N3, respectively, and are equal to the whole capacitances formed at the respective nodes N2, N3 minus the regular capacitances C1, C2, respectively.

Hereinafter an n-channel type MOS transistor is represented by an NMOSb with b being a serial number for identification and a p-channel type MOS transistor is represented by a PMOSb with b being a serial number for identification.

The subsequent explanation will be made on the basis of the assumptions that circuit parameters are selected to the following equations (3), (4), (5a) and (5b):

$$\Delta V(N2) = Vth(NMOS1) + |Vth(PMOS1)| + V1\mathit{eff} \quad (3)$$

$$\Delta V(N3) = Vth(NMOS2) + |Vth(PMOS2)| + V2\mathit{eff} \quad (4)$$

$$V1\mathit{eff} > 0 \quad (5a)$$

$$V2\mathit{eff} > 0 \quad (5b),$$

where Vth(aMOSb) represents a threshold voltage of an a (a=p or n)-channel type MOS transistor b (b=a serial number for identification), and Vceff is defined as a voltage applied to a gate terminal of the MOS transistor and having a value sufficient to turn the MOS transistor ON, minus a threshold voltage of the MOS transistor, and referred to as an operative voltage with c being a serial number for identification.

Assume that the input pulse VIN is input to a node N1 (see FIG. 1A), and a power source for the circuit is turned on in time between times t0 and t1 in FIG. 1B. The node N2 is at a voltage lower by a voltage approximately equal to |Vth(PMOS1)| than the high-voltage power supply voltage VDD, and the node N3 is at a voltage higher by a voltage approximately equal to |Vth(PMOS2)| than the low-voltage power supply voltage VSS. PMOS3 receives the voltage of the node N2 as its gate voltage and NMOS3 receives the voltage of the node N3 as its gate voltage. At this time there is possibility that both PMOS3 and NMOS3 connected in series will be in their weakly conducting (ON) states, and consequently, there is a danger that a through current flows from the high-voltage power supply line VDD to the low-voltage power supply line VSS through PMOS3 and NMOS3, and instability is caused in a signal voltage at a node N4 depending upon the amount of the through current. This problem can be solved by varying a voltage of the input pulse VIN at the instant of the power turn-on or immediately after the instant of the power turn-on so as to turn one of PMOS3 and NMOS3 off.

When the input pulse VIN changes by $+\Delta V$ from a low level (hereinafter referred to as "L") to a high level (hereinafter referred to as "H"), the voltages at the nodes N2 and N3 rise by $\Delta V(N2)$ and $\Delta V(N3)$ due to capacitive coupling by capacitances C1 and C2, respectively.

In this case, the voltage V(N2) at the node N2 is obtained by using the above equation (3) as shown below.

$$V(N2) = VDD + \Delta V(N2) - |Vth(PMOS1)| \quad (6)$$
$$= VDD + Vth(NMOS1) + V1\mathit{eff}$$

This indicates that PMOS3 is driven into its highly non-conducting (OFF) state.

The voltage V(N3) at the node N3 is obtained by using the above equation (4) as shown below.

$$V(N3) = VSS + \Delta V(N3) + |Vth(PMOS2)| \quad (7)$$
$$= VSS + Vth(NMOS2) + 2|Vth(PMOS2)| + V2\mathit{eff}$$

This indicates that NMOS3 is in its ON state.

As a result, when the voltage of the input pulse VIN changes by $+\Delta V$, the OFF state of PMOS3 and the ON state of NMOS3 are caused approximately simultaneously.

During time from t1 to t2, V(N2)=VDD+Vth(NMOS1)+V1eff, therefore NMOS is turned ON and V(N2) is decreasing, and NMOS1 is cut off when V(N2) is near a voltage equal to VDD+Vth(NMOS1). At this time the gate voltage of PMOS3 is V(N2) which is VDD+Vth(NMOS1), and the source voltage is at the voltage of VDD, and therefore PMOS is maintained in the OFF state.

Similarly, since V(N3)=VSS+Vth(NMOS2)+2|Vth(PMOS2)|+V2eff, PMOS2 is turned ON, and V(N3) is decreasing, but PMOS2 is cut off when V(N3) is near a voltage equal to VSS+|Vth(PMOS2)|.

In this case, if |Vth(PMOS2)|≧Vth(NMOS3), NMOS3 maintains its ON state, but if |Vth(PMOS2)|<Vth(NMOS3), NMOS3 is cut off and goes into an OFF state.

Here the case in which |Vth(PMOS2)|≧Vth(NMOS3) will be discussed. Since PMOS3 maintains its OFF state, if NMOS3 can discharge an electric charge C(N4)×(VINT−VSS) stored at the node N4 into the line VSS, the voltage V(N4) at the node N4 can be made equal to the voltage of the line VSS. C(N4) represents a capacitance formed at the node 4, and VINT represents a voltage of the node N4 at time t1.

A current provided when the gate voltage V(N2) of NMOS3 becomes equal to VSS+|Vth(PMOS2)|shall be represented by the following notation (8):

$$I(NMOS3, Vth(PMOS2)) \quad (8)$$

The voltage V(N4) at the node N4 is made equal to VSS if the circuit parameters are selected so as to satisfy at least the following inequality (9):

$$I(NMOS3, Vth(PMOS2))\times(t2-t1) \geq C(N4)\times(VINT-VSS) \quad (9)$$

And if the following inequality (10) is satisfied:

$$|Vth(PMOS2)| < Vth(NMOS3) \quad (10),$$

NMOS3 is cut off when V(N2) becomes equal to Vth(NMOS3).

Let teff1 be time required for NMOS3 to be cutoff from time t1. PMOS3 is in the OFF state, and therefore the charge Q'(1) discharged by NMOS3 is given by the following equation (11) integrating I(t) between times t1 and (t1+teff1):

$$Q'(1) = \int I(t)dt \quad (11)$$

where let β=a current conversion factor in NMOS3,
  Q(t)=the amount of charge at the node N4 at time t,
  C(N4)=a capacitance formed at the node N4, then
  (a) if Q(t)/C(N4)<V(N3)(t)−Vth(NMOS2),
     I(t)=β((V(N3)(t)−Vth(NMOS2))(Q(t)/C(N4))−(Q(t)/C(N4))×(Q(t)/C(N4))/2, and
  (b) if Q(t)/C(N4)≧(V(N3)(t)−Vth(NMOS2)),
     I(t)=β(V(N3)(t)−Vth(NMOS2))×(V(N3)(t)−Vth(NMOS2))/2.

If Q'(1)=Q(t=t1), the voltage V(N4) at the node 4 becomes equal to the low-voltage power supply voltage VSS. Conversely speaking, by letting Q'(1) in the above equation (11)=Q(t=t1), an integrating time tx is obtained from the equation (11), and if the integrating time tx satisfies the inequality tx≦teff1, the voltage V(N4) at the node N4 can be made equal to VSS.

When the input pulse VIN changes by $-\Delta V$ from "H" to "L" at time t2, the voltages at the nodes N2 and N3 fall by $\Delta V(N2)$ and $\Delta V(N3)$ from the corresponding voltages immediately prior to time 2 by capacitive couplings of capacitances C1 and C2, respectively, as described above. Here, the voltage V(N3) at the node N3 is represented by the following equation (12) obtained by using the above equation (4) and others:

$$V(N3) = VSS + |Vth(PMOS2)| - \Delta V(N3) \quad (12)$$
$$= VSS - Vth(NMOS2) - V2\mathit{eff}$$

As a result, the voltage V(N3) at the node N3, that is, the gate voltage of NMOS3 becomes lower by Vth(NMOS2)+V1eff than the source voltage VSS of NMOS3, and thereby NMOS3 is brought into the OFF state.

The voltage V(N2) at the node N2 is represented by the following equation (13) obtained by using the above equation (3) and others:

$$V(N2) = VDD + |Vth(NMOS1)| - \Delta V(N2) \quad (13)$$
$$= VDD - |Vth(PMOS1)| - V1\mathit{eff}$$

As a result, the voltage V(N2) at the node N2, that is, the gate voltage of PMOS3 becomes lower by |Vth(PMOS1)|+V1eff than the source voltage VDD of PMOS3, and thereby PMOS3 is brought into the ON state.

During time from t2 to t3, if Vth(NMOS2)≧|Vth(PMOS2)|+V1eff, NMOS2 is brought into the ON state, the voltage V(N3) at the node N3 continues to rise, but NMOS2 is cut off when it becomes near the voltage VSS−|Vth(PMOS1)|, and thereby NMOS3 maintains the OFF state.

At time t2, as is apparent from the above equation (6), the gate voltage V(N2) of PMOS1 is lower by |Vth(PMOS1)|+V1eff than the source voltage VDD of PMOS1, PMOS is brought into the ON state, and the voltage V(N2) at the node N2 becomes higher, but PMOS1 is cut off and is brought into the OFF state when the voltage V(N2) becomes near |Vth(PMOS1)|.

As a result, if the following inequality (14) is satisfied:

$$|Vth(PMOS1)| \geq |Vth(PMOS3)| \quad (14),$$

PMOS3 maintains the ON state.

Since NMOS3 maintains the OFF state, if PMOS3 can discharge a charge C(N4)×(VDD−VSS) stored at the node 4 toward the high-voltage power supply line VDD, the voltage V(N4) at the node N4 can be made equal to VDD.

A current through PMOS3 when the gate voltage V(N2) of PMOS3 becomes equal to VDD−|Vth(PMOS1)| shall be represented by the following notation (15):

$$I(PMOS3, Vth(PMOS1)) \quad (15)$$

The voltage V(N4) at the node N4 is made equal to VDD if the circuit parameters are selected so as to satisfy at least the following inequality (16):

$$I(PMOS3, Vth(PMOS1)) \times (t3-t2) \geq C(N4) \times (VDD-VSS) \quad (16)$$

And if |Vth(PMOS1)|<|Vth(PMOS3)|, PMOS3 is cut off.

Let teff2 be time required for PMOS3 to be cutoff from time t2. NMOS3 is in the OFF state, and therefore the charge Q'(2) discharged by PMOS3 is given by the following equation (17) integrating I(t) between times t2 and (t2+teff2):

$$Q'(2) = \int I(t)dt \quad (17)$$

where let βP=a current conversion factor in PMOS3,
Q(t)=the amount of charge at the node N4 at time t,
C(N4)=a capacitance formed at the node N4, and (a) if Q(t)/C(N4)<V(N3)(t)−|Vth(PMOS1)|, the current flowing through PMOS3, I(t)=βP {(V(N3)(t)−|Vth(PMOS1)|)(Q(t)/C(N4))−(Q(t)/C(N4))×(Q(t)/C(N4))/2}, and (b) if Q(t)/C(N4)≧(V(N3)(t)−|Vth(PMOS1)|), the current flowing through PMOS3, I(t)=βP(V(N3)(t)−Vth(NMOS2))×(V(N3)(t)−Vth(NMOS2))/2.

If Q'(2)=Q(t=t2), the voltage V(N4) at the node 4 becomes equal to the low-voltage power supply voltage VSS. Conversely speaking, by letting Q'(2) in the above equation (17)= Q(t=t2), an integrating time tx is obtained from the equation (17), and if the integrating time tx satisfies the inequality tx≦teff2, the voltage V(N4) at the node N4 can be made equal to VSS.

When the input pulse VIN changes by +ΔV from "L" to "H" again at time t3, the voltages at the nodes N2 and N3 rise by ΔV(N2) and ΔV(N3) from the corresponding voltages immediately prior to time 3 by capacitive couplings of capacitances C1 and C2, respectively, as described above. Here, the voltage V(N2) at the node N2 is represented by the following equation (18) obtained by using the above equation (3) and others:

$$V(N2) = VDD - |Vth(PMOS1)| + \Delta V(N2) = VDD + Vth(NMOS1) + V1eff \quad (18)$$

As a result, PMOS3 is brought into the strongly OFF state, and the voltage V(N3) at the node N3 is represented by the following equation (19) obtained by using the above equation (4) and others:

$$V(N3) = VSS - |Vth(PMOS2)| + \Delta V(N3)$$
$$= VSS + Vth(NMOS2) + V2eff \quad (19)$$

Thereby NMOS3 is brought into the ON state.

During time from t3 to t4, since V(N2)=VDD+Vth (NMOS1)+V1eff, NMOS1 is brought into the ON state, and V(N2) decreases, but NMOS1 is cut off when V(N2) becomes near a voltage VDD+Vth(NMOS1). At this time, the gate voltage of PMOS3, V(N2) is VDD+Vth(NMOS1), and the source voltage of PMOS3 is VDD, and therefore PMOS3 maintains the OFF state.

Similarly, if |Vth(PMOS2)|≦Vth(NMOS2)+V2eff, PMOS2 is brought into the ON state, the voltage V(N3) at the node N3 decreases, but PMOS2 is cut off when the voltage V(N3) becomes near the voltage VSS+|Vth(PMOS2)|.

At this time, if |Vth(PMOS2)|≧Vth(NMOS3), NMOS3 maintains the ON state, but if |Vth(PMOS2)|<Vth(NMOS3), NMOS3 is cut off and brought into the OFF state when V(N3) decreases to VSS+Vth(NMOS3).

Here the relationship between |Vth(PMOS2)|and Vth (NMOS3) is the same as that explained in connection with the operation during the time between times t1 and t2.

The sequence of operations described above is repeated such that the input pulses VIN are voltage-level-converted into pulses V(N4) of waveforms having an amplitude (VDD− VSS) as illustrated in FIG. 1B.

A plurality of the circuits of the configuration of FIG. 1A can be cascaded as desired depending upon the application and other practical considerations.

Embodiment 2

Figure 3:
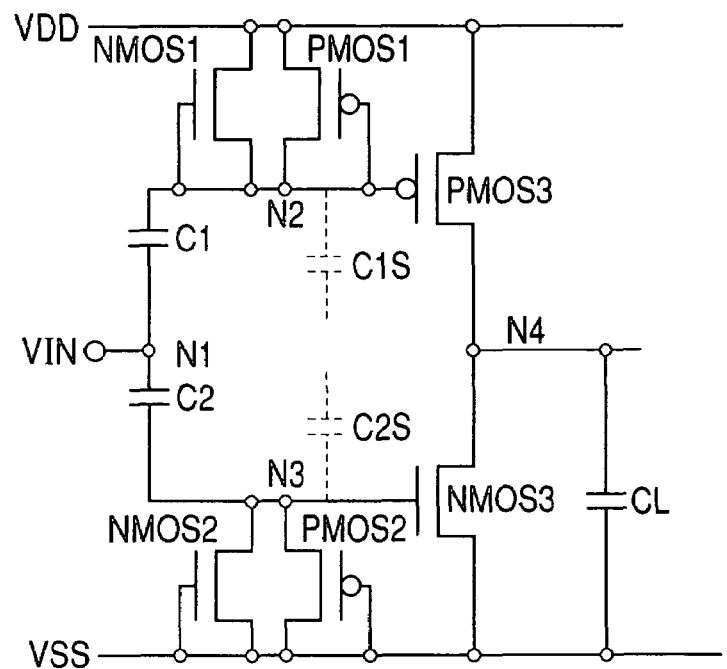
FIG. 3 is a circuit diagram of another embodiment of a voltage level converter fabricated in the liquid crystal display device in accordance with the present invention.

FIG. 3 is a circuit diagram of another embodiment of a voltage level converter VLC fabricated in the liquid crystal display device in accordance with the present invention. The configuration of FIG. 3 is similar to that of FIG. 1A, except that a capacitance CL is connected between the output terminal and the low-voltage power supply line VSS. The operation of this configuration is approximately the same in performance as that of FIG. 1A.

Here, in the operation of the circuit of FIG. 1A, for simplicity, VINT is replaced with VDD in the inequality (9). The inequality (9) is assumed to be a condition for making V(N4) equal to VSS, and the inequality (16) is assumed to be a condition for making V(N4) equal to VDD.

First, the following inequalities (20) and (21) are obtained from the inequalities (9) and (16), respectively:

$$I(NMOS3, Vth(PMOS2)) \times (t2-t1) \geq \{C(N4)+CL\} \times (VDD-VSS) \quad (20),$$

$$I(PMOS3, Vth(PMOS1)) \times (t3-t2) \geq \{C(N4)+CL\} \times (VDD-VSS) \quad (21).$$

Solving these inequalities (20) and (21) for the load capacitance CL yields the following inequalities (22) and (23):

$$CL \leq \{I(NMOS3, Vth(PMOS2)) \times (t2-t1)\}/(VDD-VSS)-C(N4) \quad (22)$$

$$CL \leq \{I(PMOS3, Vth(PMOS1)) \times (t3-t2)\}/(VDD-VSS)-C(N4) \quad (23)$$

Solving the inequalities (20) and (21) for the times yields the following inequalities (24) and (25):

$$(t2-t1) \geq \{C(N4)+CL\} \times (VDD-VSS)/I(NMOS3, Vth(PMOS2)) \quad (24)$$

$$(t3-t2) \geq \{C(N4)+CL\} \times (VDD-VSS)/I(PMOS3, Vth(PMOS1)) \quad (25)$$

Solving the inequalities (20) and (21) for the currents yields the following inequalities (26) and (27):

$$I(NMOS3, Vth(PMOS2)) \geq \{C(N4)+CL\} \times (VDD-VSS)/(t2-t1) \quad (26)$$

$$I(PMOS3, Vth(PMOS1)) \geq \{C(N4)+CL\} \times (VDD-VSS)/(t3-t2) \quad (27)$$

Here, when the right side in each of the above inequalities (20) to (27) is assumed to be fixed values, the inequalities (22) and (23) limit the load capacitance, the inequalities (24) and (25) limit the maximum frequency, and the inequalities (26) and (27) limit the currents in the MOS transistors, that is, the dimensions of their gates. This means that it is necessary to select or verify the circuit parameters of the voltage level converter circuit of this embodiment individually depending upon its load (a load capacitance).

Figure 4A:
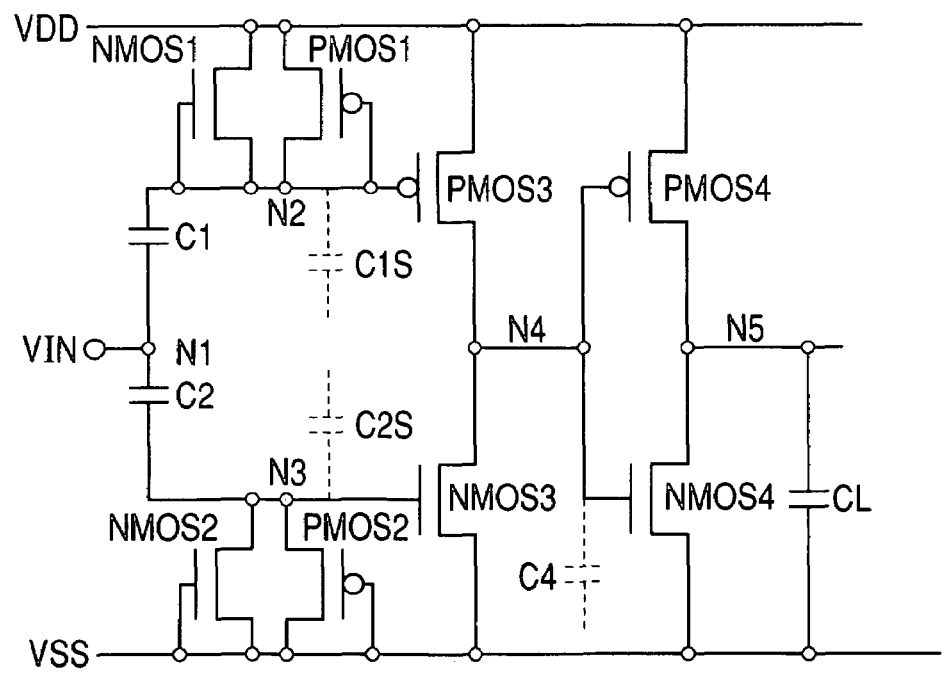
FIG. 4A is a circuit diagram of another embodiment of a voltage level converter fabricated in the liquid crystal display device in accordance with the present invention.
Figure 4B:
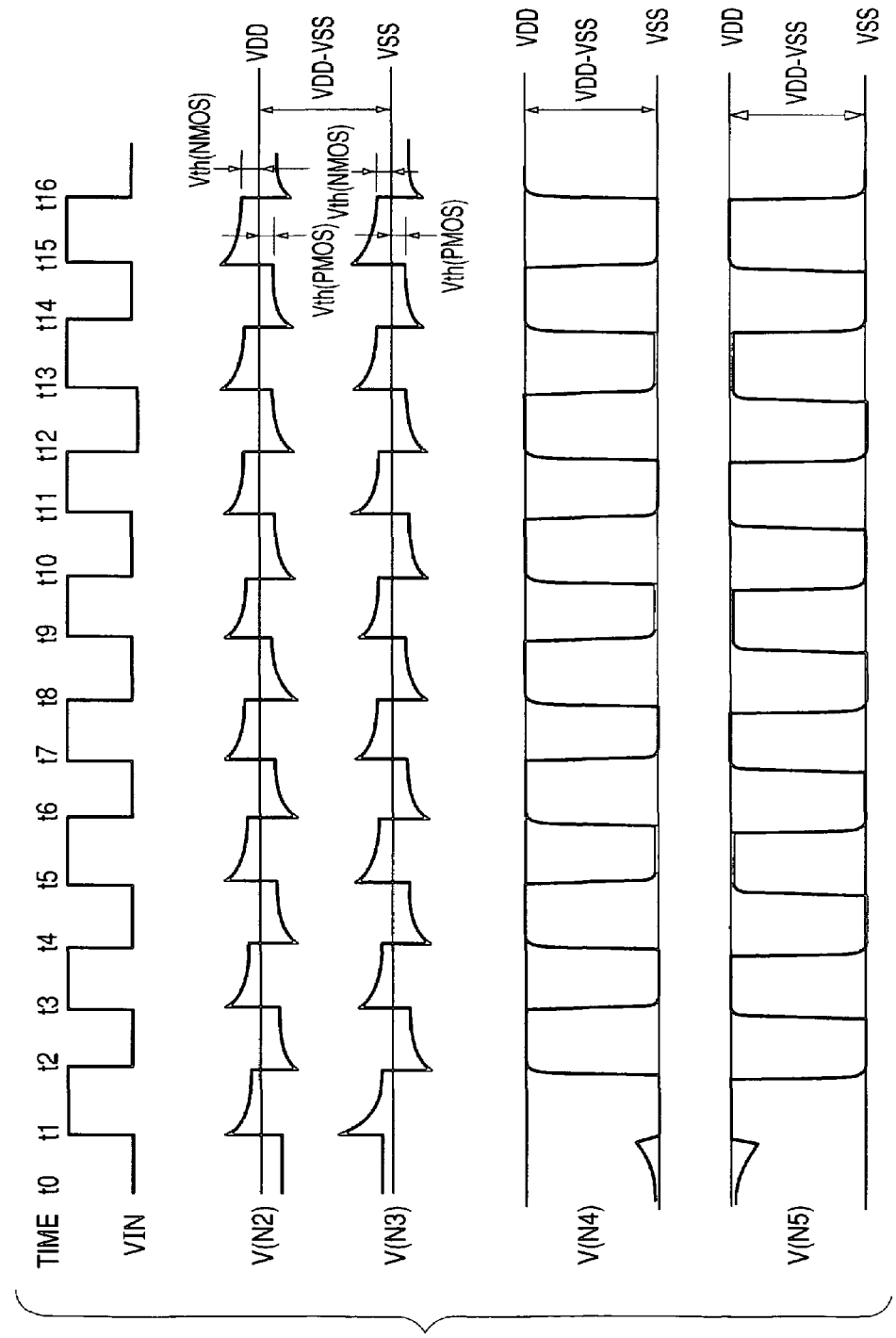
FIG. 4B illustrates waveforms of an input pulse and signals at four nodes in the voltage level converter of FIG. 4A.

FIG. 4A is a circuit diagram of another embodiment of the voltage level converter VLC in accordance with the present invention modified in view of the above requirement, and FIG. 4B illustrates pulse waveforms of an input pulse and signals at four nodes in the voltage level converter of FIG. 4A.

FIG. 4A is a circuit diagram similar to that of FIG. 3, except that a CMOS inverter is added whose input terminal is coupled to the node N4 and whose output terminal, a node N5, is coupled to the load capacitance CL. There are provided a p-channel type MOS transistor PMOS4 with its first terminal coupled to the high-voltage power supply line VDD and an n-channel type MOS transistor NMOS4 with its second terminal coupled to the low-voltage power supply line VSS.

The gate terminals of the p-channel type MOS transistor PMOS4 and the n-channel type MOS transistor NMOS4 are coupled to the junction point of a second terminal of the p-channel type MOS transistor PMOS3 and a first terminal of the n-channel type MOS transistor NMOS4. The junction point of a second terminal of the p-channel type MOS transistor PMOS4 and a first terminal of the n-channel type MOS transistor NMOS4 forms the output terminal, and the capacitance CL is coupled between the output terminal and the low-voltage power supply line VSS.

In the operation of this circuit, changes in voltages VIN, V(N2), V(N3) and V(N4) with time at are the same as those explained in connection with Embodiment 1. The voltage V(N4) is supplied to the CMOS inverter composed of PMOS4 and NMOS4 as its input pulse, the voltage V(N5) at the node N5 changes with time as shown in FIG. 4B, and the pulse voltages charge the load capacitance CL. Here discharging load capacitance in this circuit are limited to parasitic capacitances such as a gate capacitance of the CMOS inverter composed of PMOS4 and NMOS4 and a wiring capacitance C4 at the node N4. In general, the parasitic capacitances can be made smaller than the load capacitance CL, and therefore design parameters of the circuit components can be made realistic values. Furthermore, the voltage level converter of this embodiment of the same circuit parameters an advantage of wider application compared with Embodiment 1, for example.

Embodiment 3

Figure 5:
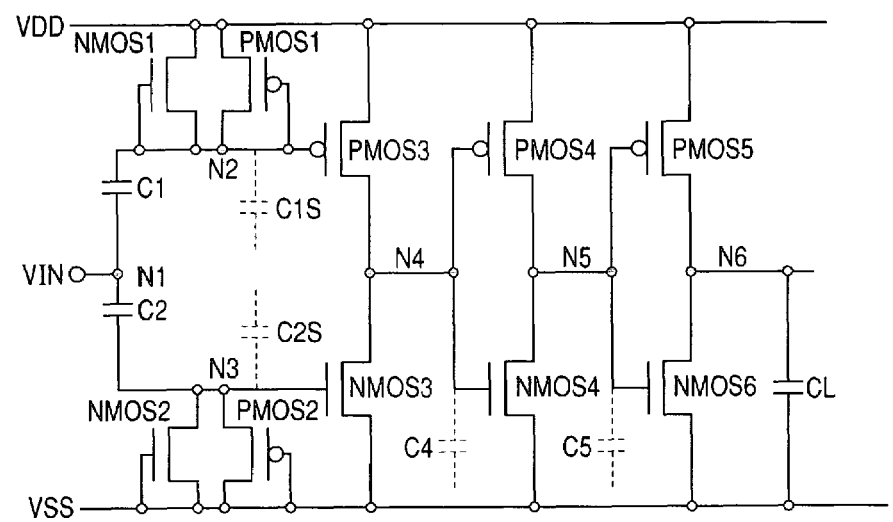
FIG. 5 is a circuit diagram of another embodiment of a voltage level converter fabricated in the liquid crystal display device in accordance with the present invention.

FIG. 5 is a circuit diagram of another embodiment of the voltage level converter VLC in accordance with the present invention, and is similar to that of FIG. 3.

The circuit diagram of FIG. 5 differs from that of FIG. 4A in that another stage of the CMOS is added which is composed of a p-channel type MOS transistor PMOS5 and an n-channel type MOS transistor NMOS5, and the load capacitance CL is coupled between its output terminal and the low-voltage power supply line VSS. In FIG. 5, reference character C5 denotes a parasitic capacitance such as a wiring capacitance at the node N5, and a node N6 forms the output terminal. The voltage level converter of this configuration is advantageous in the case of a large load capacitance.

Figure 6:
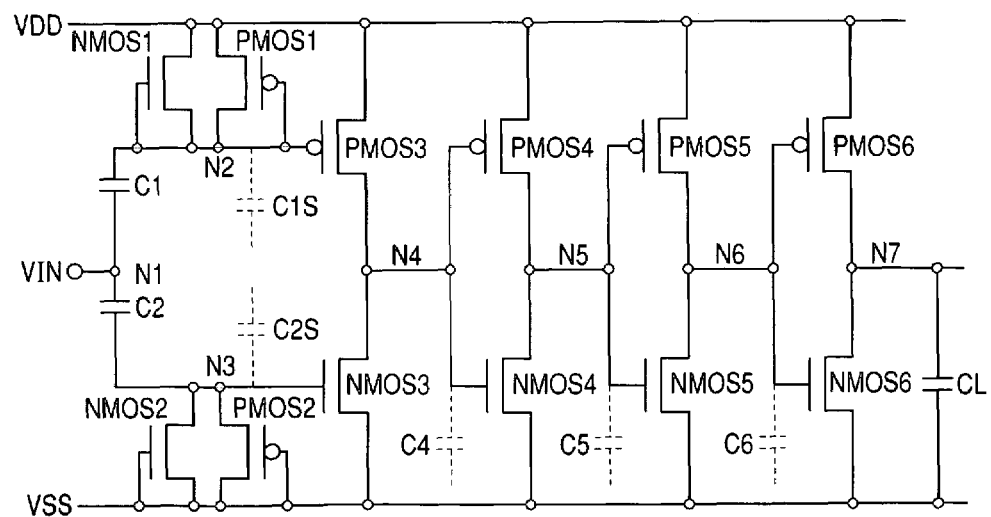
FIG. 6 is a circuit diagram of another embodiment of a voltage level converter fabricated in the liquid crystal display device in accordance with the present invention.

It is needles to say that, to enhance the beneficial effects of this embodiment further, still another stage of the CMOS may be added which is composed of a p-channel type MOS transistor PMOS6 and an n-channel type MOS transistor NMOS6, and the load capacitance CL is coupled between its output terminal and the low-voltage power supply line VSS as shown in FIG. 6. In FIG. 6, reference character C6 denotes a parasitic capacitance such as a wiring capacitance at the node N6, and a node N7 forms the output terminal.

Embodiment 4

Figure 7A:
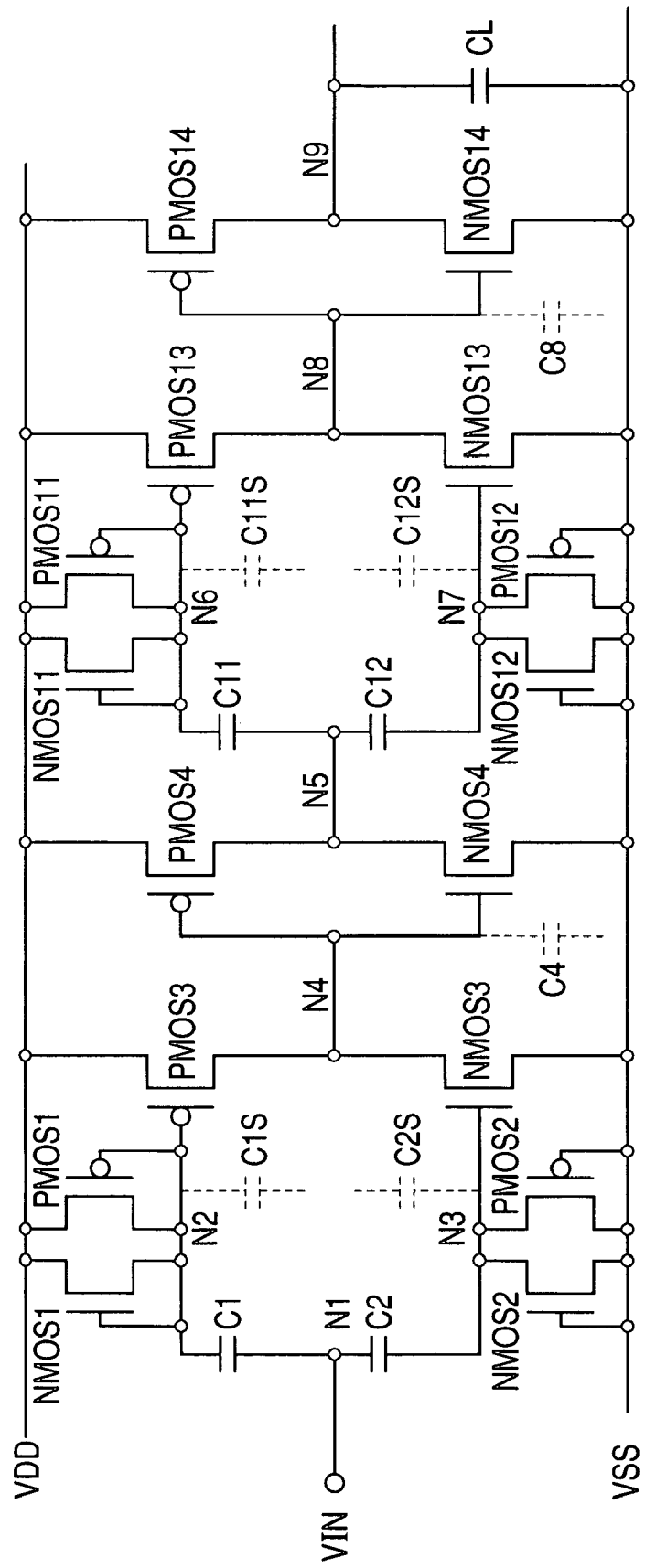
FIG. 7A is a circuit diagram of another embodiment of a voltage level converter fabricated in the liquid crystal display device in accordance with the present invention.

FIG. 7A is a circuit diagram of another embodiment of the voltage level converter fabricated on a surface of one of two substrate of the liquid crystal display device in accordance with the present invention.

In FIG. 7A, the voltage level converter is composed of a plurality (two in this embodiment) of stages comprising the above-described voltage level converters VLC coupled in cascade. Specifically, a first stage is formed of the circuit configuration shown in FIG. 1A, a second stage succeeding the first stage is formed of the circuit configuration shown in FIG. 4A, and aCMOS composed of PMOS4 and NMOS4 interposed therebetween couples the first and second stages. A node N9 forms an output terminal of the voltage level converter of this embodiment.

Figure 7B:
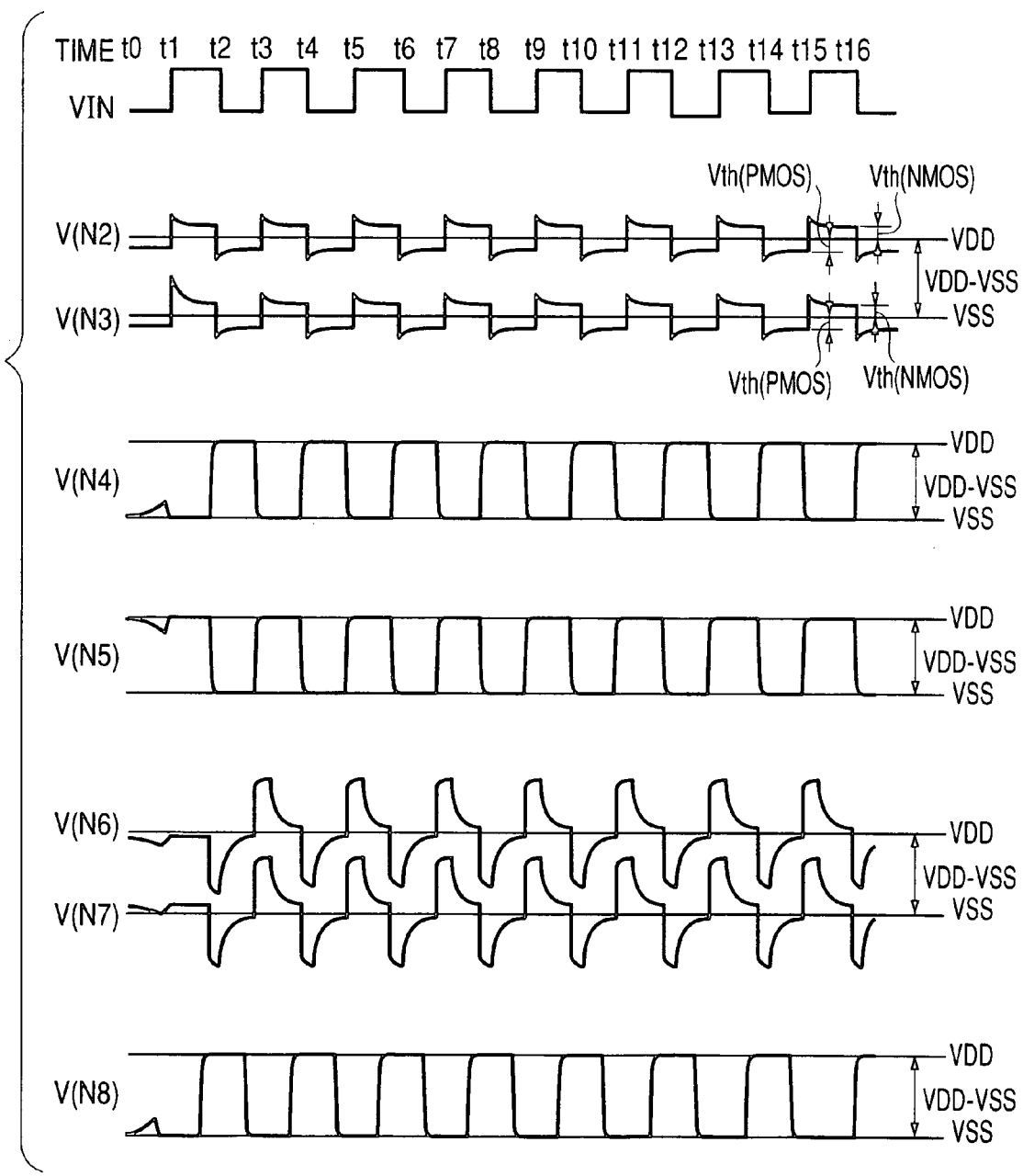
FIG. 7B illustrates waveforms of an input pulse and signals at seven nodes in the voltage level converter of FIG. 7A.

FIG. 7B illustrates waveforms of the input pulse VIN and voltages V(N2) to V(N8) at the nodes N2 to N8 in the voltage level converter of FIG. 7A. In the operation of the above-described circuit, waveforms of the voltages VIN, V(N2), V(N3), V(N4) and V(N5) are the same as those explained in connection with Embodiment 2.

In FIG. 7A, reference characters C11, C12, C11S and C12S denote capacitances corresponding to the capacitances C1, C2, C1S and C2S, respectively, and reference character C8 denotes a parasitic capacitance formed at the node N8.

The voltages V(N6) and V(N7) at the nodes. N6 and N7, respectively, vary with time in response to the voltage V(N5) at the node N5 in the same way as the voltages V(N2) and V(N3) vary with time in response to the input pulse VIN, and the following inequality (28) is usually satisfied as far as the above-explained equations (1), (2), (3), (4) and (−5) are satisfied:

$$\text{VIN} \ll \text{VDD} \tag{28}$$

and also the following equations (29) and (30) are satisfied:

$$V(N5)\text{max} = VDD \tag{29}$$

$$V(N5)\text{min} = VSS \tag{30}$$

For example, if the parameters of the pair of PMOS13 and NMOS13 are the same as those of the pair of PMOS3 and NMOS3, a greater effective gate (peak) voltage and a longer time teff required for a MOS transistor to be cutoff are obtained.

Consequently, a larger load, that is, a CMOS inverter (composed of PMOS14 and NMOS14) having a greater driving capability can be driven, and as a result a larger load capacitance CL can be driven.

In this embodiment, at a time when the voltages V(N6) and V(N7) exceed the threshold voltages of PMOS13 and NMOS13, respectively, the pair of transistors are completely switched between ON and OFF, and consequently, the pulse signals can be transferred to the succeeding stage with less delay time than in the case of usual CMOS inverters.

Embodiment 5

In each of all the above-described embodiments, a series combination of the capacitance C1 and the n-channel type MOS transistor NMOS1 is coupled between the input terminal for receiving the input pulse VIN and the high-voltage power supply line VDD, and the n-channel type MOS transistor NMOS1 functions as a diode.

Figure 8A:
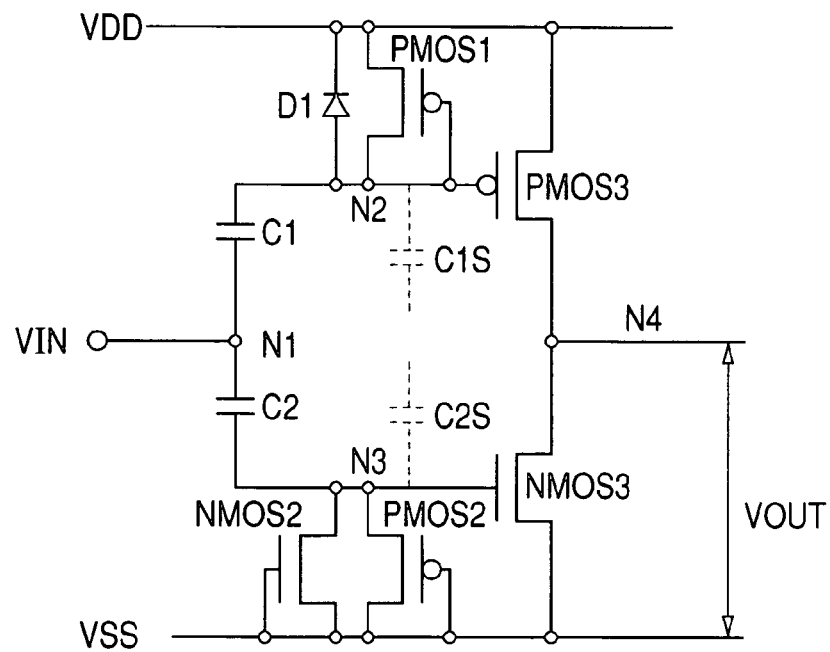
FIGS. 8A to 8D are circuit diagrams of other embodiments of a voltage level converter fabricated in the liquid crystal display device in accordance with the present invention, respectively.

Therefore, take the circuit configuration of FIG. 1A, for example, the n-channel type MOS transistor NMOS1 can be replaced by a diode D1 with its cathode coupled to the high-voltage power supply line VDD as shown in FIG. 8A.

In each of all the above-described embodiments, a series combination of the capacitance C2 and the n-channel type MOS transistor NMOS2 is coupled between the input terminal for receiving the input pulse VIN and the low-voltage power supply line VSS, and the n-channel type MOS transistor NMOS2 functions as a diode.

Figure 8B:
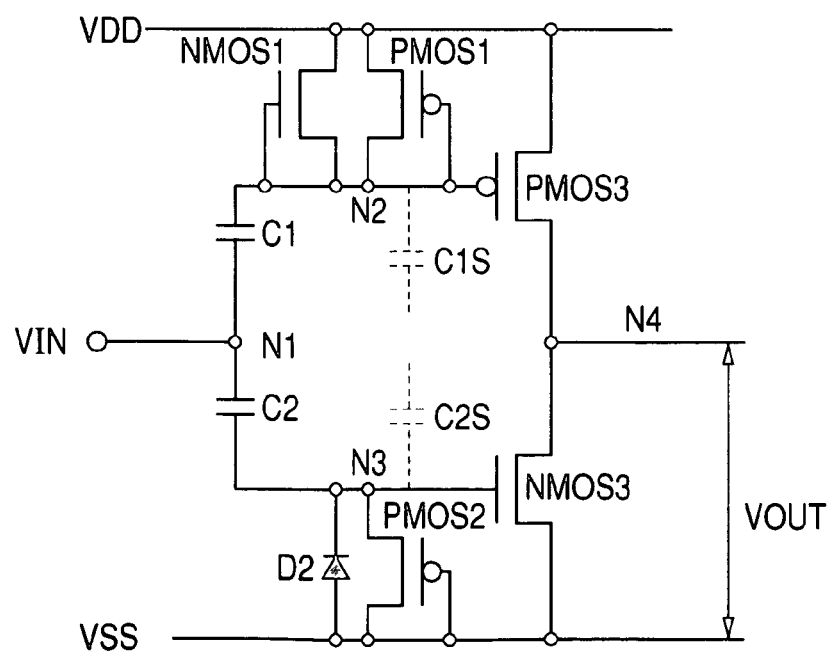

Therefore, take the circuit configuration of FIG. 1A, for example, the n-channel type MOS transistor NMOS2 can be replaced by a diode D2 with its anode coupled to the low-voltage power supply line VSS as shown in FIG. 8B.

Figure 8C:
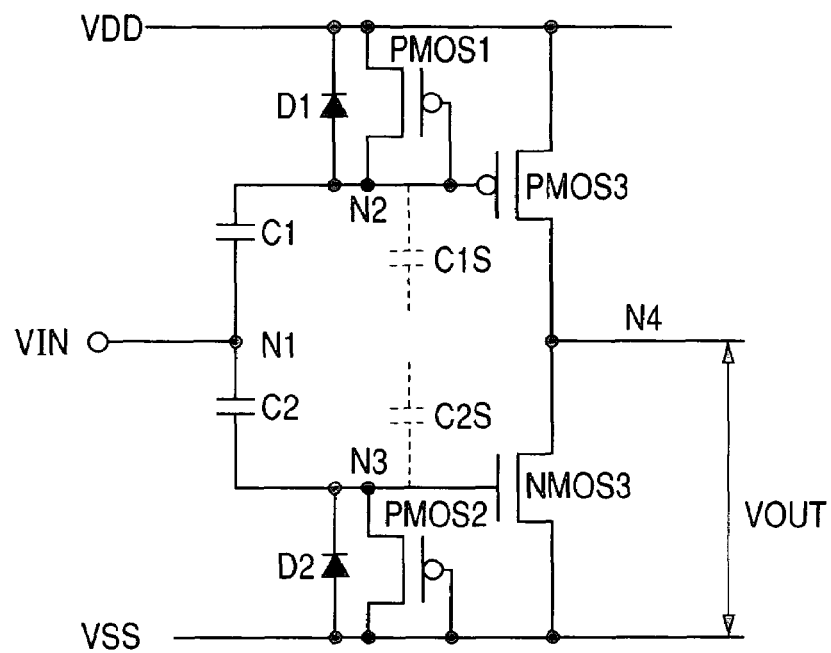

Furthermore, needless to say, take the circuit configuration of FIG. 1A, for example, the n-channel type MOS transistors NMOS1 and NMOS2 can be replaced by the diode D1 with its cathode coupled to the high-voltage power supply line VDD and the diode D2 with its anode coupled to the low-voltage power supply line VSS, respectively, as shown in FIG. 8C.

Figure 8D:
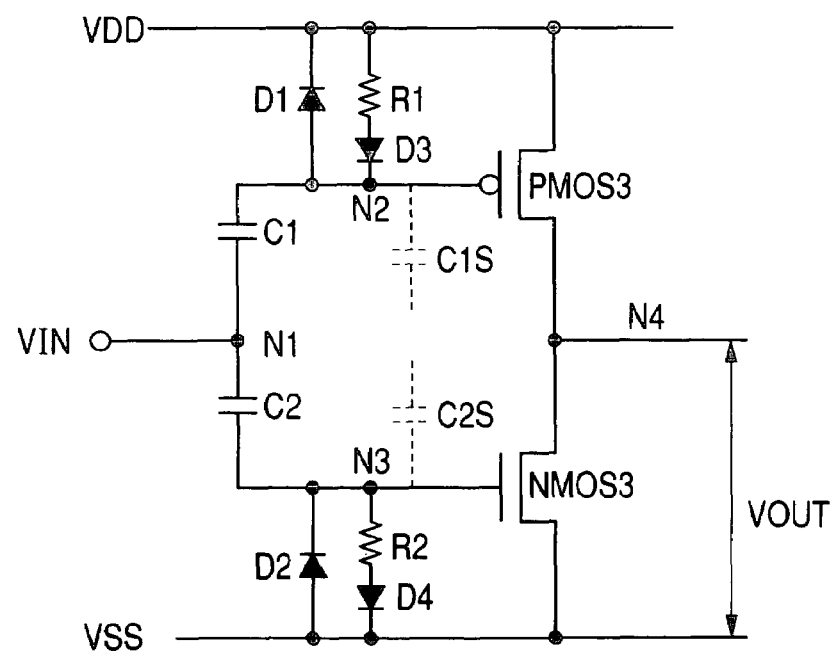

Furthermore, in the above embodiment, the p-channel type MOS transistors PMOS1 and PMOS2 can be replaced by a series combination of a resistance R1 and a diode D3, and a series combination of a resistance R2 and a diode D4, respectively, as shown in FIG. 8D. Needless to say, in this case, only one of the p-channel type MOS transistors PMOS1 and PMOS2 can be replaced by a series combination of a resistance R1 and a diode D3.

Figure 9A:
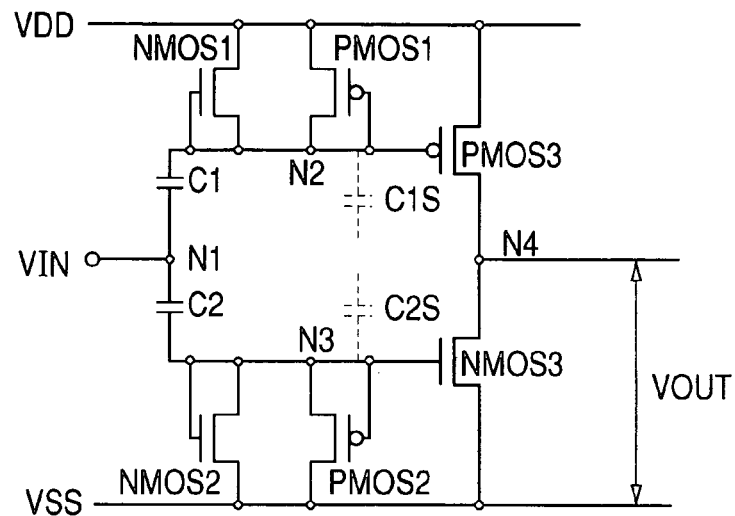
FIGS. 9A to 9C are circuit diagrams of other embodiments of a voltage level converter fabricated in the liquid crystal display device in accordance with the present invention, respectively.

Furthermore, in the circuit configuration of FIG. 1A, for example, the gate terminals of NMOS2 and PMOS2 are coupled to the low-voltage power supply line VSS. However, as shown in FIG. 9A, the gate terminals of NMOS2 and PMOS2 may be coupled to the other corresponding terminals of NMOS2 and PMOS2 other than the terminals of NMOS2 and PMOS2 coupled to the low-voltage power supply line VSS.

Figure 9B:
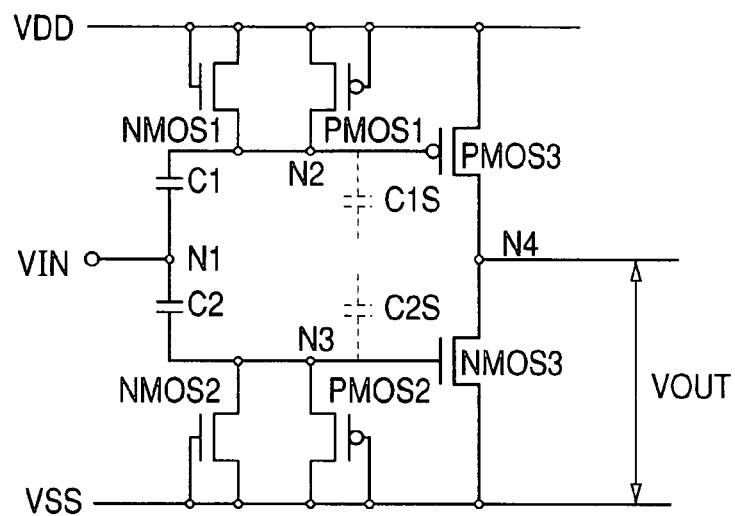

Furthermore, in the circuit configuration of FIG. 1A, for example, the gate terminals of NMOS1 and PMOS1 are coupled to the corresponding terminals of NMOS1 and PMOS1 other than the terminals of NMOS1 and PMOS1 coupled to the high-voltage power supply line VDD. However, as shown in FIG. 9B, the gate terminals of NMOS1 and PMOS1 may be coupled to the high-voltage power supply line VDD.

Figure 9C:
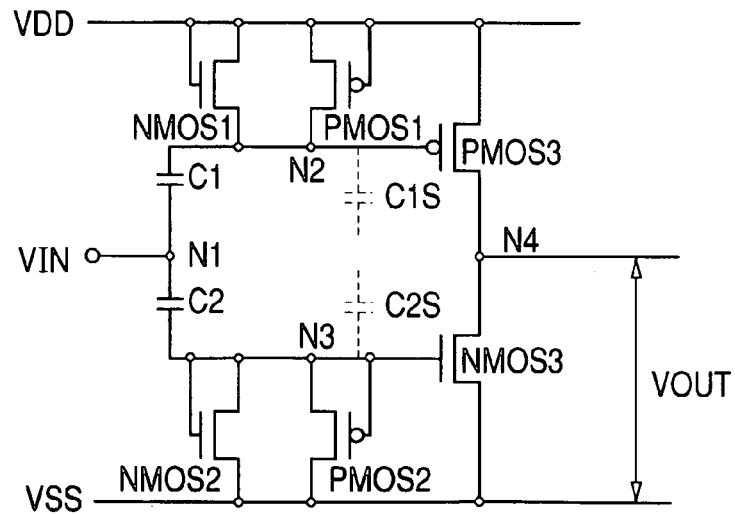

Needless to say, both of the two above features explained in connection with FIGS. 9A and 9B can be employed as shown in FIG. 9C.

Embodiment 6

Figure 10A:
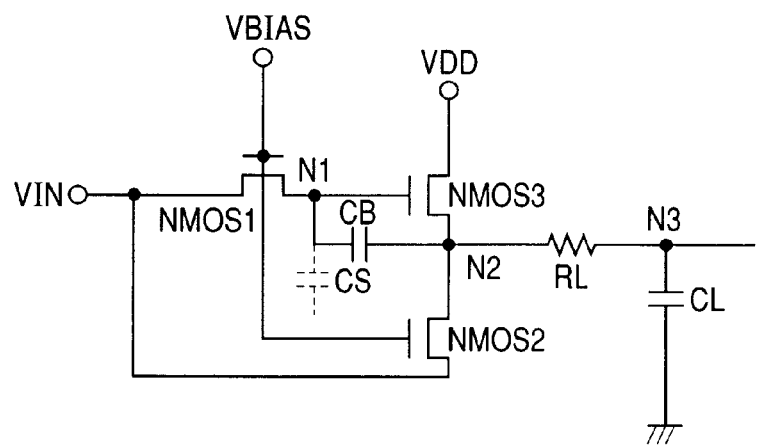
FIG. 10A is a circuit diagram of another embodiment of a voltage level converter fabricated in the liquid crystal display device in accordance with the present invention.

FIG. 10A is a circuit diagram of another embodiment of the voltage level converter VLC fabricated on a substrate of the liquid crystal display device in accordance with the present invention.

In FIG. 10A, the input terminal for receiving the input pulse VIN is coupled to first terminals of n-channel type MOS transistors NMOS1 and NMOS2, gate terminals of the n-channel type MOS transistors NMOS1 and NMOS2 are supplied with a fixed bias voltage VBIAS. A second terminal of the n-channel type MOS transistor NMOS1 is coupled to a gate terminal of an n-channel type MOS transistor NMOS3 and a first terminal of a capacitance CB. A second terminal of the n-channel type MOS transistor NMOS3 is coupled to the high-voltage power supply line VDD, and a first terminal of the transistor NMOS3 is coupled to a second terminal of the n-channel type MOS transistor NMOS2. A junction point between the second terminal of the n-channel type MOS transistor NMOS2 and the first terminal of the n-channel type MOS transistor NMOS3 is coupled to a second terminal of the capacitance CB, and forms an output terminal (a node N2).

In FIG. 10A, a series combination of a load resistance RL and a load capacitance CL serving as a resistance-capacitance load is coupled between the output terminal (the node N2) and ground. A capacitance CS indicated by broken lines in FIG. 10A denotes parasitic capacitances such as a gate capacitance of NMOS3, a source capacitance of NMOS1 and a wiring capacitance formed at the node N1, excluding the capacitance CB.

Figure 10B:
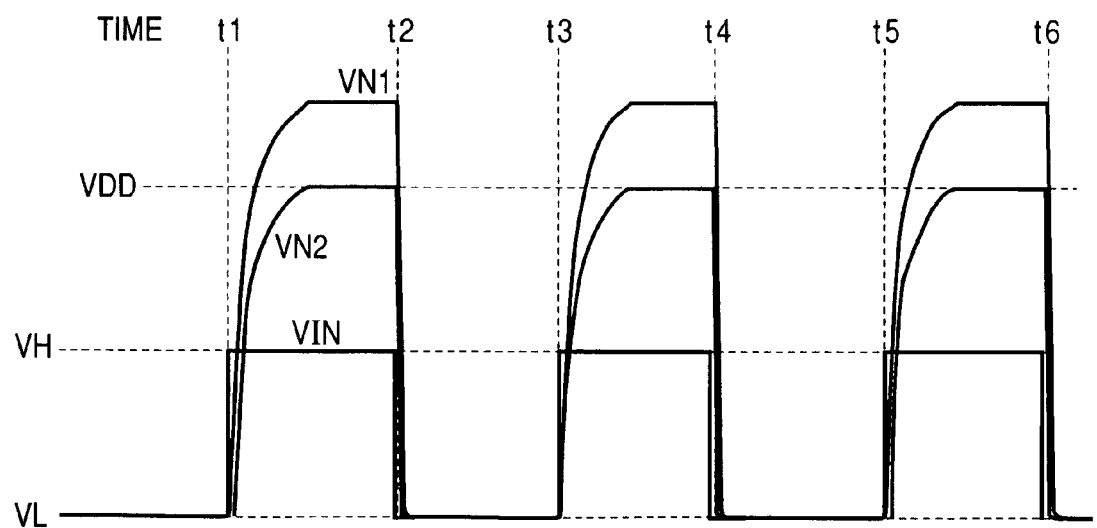
FIG. 10B illustrates waveforms of an input pulse and signals at two nodes in the voltage level converter of FIG. 10A.

FIG. 10B is a time chart illustrating waveforms of the input pulse VIN, and signal pulses at two nodes in the voltage level converter of FIG. 10A, with the abscissa representing time.

Here, let VH and VL be maximum and minimum values of the input pulse VIN, respectively. VH is assumed to be half the maximum power supply voltage VDD, as represented by the following equation (31), and VL is assumed to be ground level (GND) for simplicity.

$$VH = VDD/2 \tag{31}$$

The bias voltage VBIAS is assumed to be equal to VH, and is represented by the following equation (32):

$$VBIAS = VH = VDD/2 \tag{32}$$

Let Vth be a threshold voltage, and it is assumed that threshold voltages of all the n-channel type MOS transistors NMOS1, NMOS2 and NMOS3 are equal, and the following equation (33) is satisfied:

$$Vth = VH/3 = VDD/6 \tag{33}$$

If the level of the input pulse VIN changes from the low level (hereinafter referred to as "L") to the high level (hereinafter referred to as "H") at time t1, a voltage VN1 at the node N1 rises to a value represented by the following equation (34) through NMOS1.

$$VN1 = VH - Vth \tag{34}$$

Simultaneously with this change, NMOS3 is also brought into the ON state, and a voltage VN2 at the node N2 also begins to rise toward the voltage represented by the equation (34). At this time, the voltage VN2 at the node N2 rises more slowly than the voltage VN1 at the node N1 because the node N2 is coupled to a load circuit comprised of the load resistance RL, the node N3 and the load capacitance CL.

Let VN20 be a voltage at the node N2 at the time when the voltage VN1 at the node N1 becomes (VH−Vth) and thereby NMOS1 is cut off, and the following equation (35) is assumed to be satisfied:

$$VN1 - VN20 = VH - Vth - VN20 = Vth + \alpha \tag{35}$$

At this time, NMOS3 is brought into the ON state because its gate voltage is VN1, its drain voltage is VDD, and its source voltage is VN20. Currents from both NMOS2 and NMOS3 continue to flow into the node N2 such that the voltage VN2 at the node N2 is raised, until the voltage VN2 at the node N2 becomes (VH−Vth), and at the time the voltage VN2 becomes (VH−Vth), NMOS2 is cut off and the current ceases to flow through it.

However, at this time, the voltage VN1 rises as the voltage VN2 at the node N2 rises, because the node N1 has already been made floating due to cutoff of NMOS1, and is capacitively coupled to the node 2 via the capacitance CB.

The voltage VN11 at the node N1 at the time when the voltage VN2 at the node N2 becomes (VH−Vth) is approximately represented by the following equation (36):

$$VN11 = VH - Vth + (Vth + \alpha) \times CB/(CB + CS) \quad (36)$$

Here, if the following equation (37) is satisfied, NMOS3 maintains the ON state.

$$VN11 - (VH - Vth) = (Vth + \alpha) \times CB/(CB + CS) = Vth + \beta \quad (37)$$

where β>0

Consequently, the current from the high-voltage power supply line VDD continues to flow into the node N2 through NMOS3, and thereby the voltage VN2 at the node N2 continues to rise.

Let ΔV be an increase in the voltage VN2 after the voltage VN2 has become (VH−Vth). Then, the voltage VN1 Δ at the node N1 at this time is expressed by the following equation (38):

$$VN1\Delta = VN11 + \Delta V \times CB/(CB+CS) = VH - Vth + (Vth + \alpha + \Delta V) \times CB/(CB+CS) \quad (38)$$

The value of (VN1Δ−VN2) is obtained by subtracting the voltage VN2 at the node N2 represented by (VH−Vth+ΔV) from the voltage VN1Δ expressed by the equation (38), and as far as the following equation (39) is satisfied, NMOS3 maintains the ON state.

$$VN1\Delta - VN2 = (Vth + \alpha + \Delta V) \times CB/(CB+CS) - \Delta V > Vth \quad (39)$$

If the following relationship (41) obtained by substituting the following equation (40) in the equation (39) is satisfied, the voltage VN2 at the node N2 rises up to the voltage VDD.

$$\Delta V = VDD - (VH - Vth) \quad (40)$$

$$(Vth + \alpha + VDD - (VH - Vth)) \times CB/(CB+CS) - (VDD - (VH - Vth)) > Vth \quad (41)$$

What is essential in the circuit of this embodiment is that the voltage rise at the node N2 is slower than that at the node N1, and in other words it is necessary to select circuit parameters so as to ensure this operation, in particular, dimensions of the transistors and the coupling capacitances CB.

In the above explanation, the threshold voltages Vth were assumed to be constant at all times, but for example, in a case in which it is not permissible to neglect variations in threshold voltages with variations in the respective voltages due to the substrate effect and others, it is necessary to use actual threshold voltages Vth.

If the voltage level of the input pulse VIN changes from "H" to "L" at time t2, the voltage of the input pulse VIN serves as the source voltages of NMOS1 and NMOS2, and thereby both the transistors NMOS1 and NMOS2 are turned ON since the gate voltages of both the transistors NMOS1 and NMOS2 are VBIAS at this time, and consequently, the charge stored at the node N1 is discharged toward the input terminal for the input pulse VIN through NMOS1.

As is apparent from the previous explanation, discharging of the charge stored at the node N1 is fast, by this discharging NMOS3 is turned OFF, and as a result supply of charge (current) from the high-voltage power supply line VDD is ceased.

The charges stored at the nodes N2 and N3 are discharged toward the input terminal for the input pulse VIN through NMOS2, the voltages VN1, VN2 and VN3 at the nodes N1, N2 and N3, respectively, become VL (=GND). The sequence of operations described above is repeated.

Embodiment 7

Figure 11A:
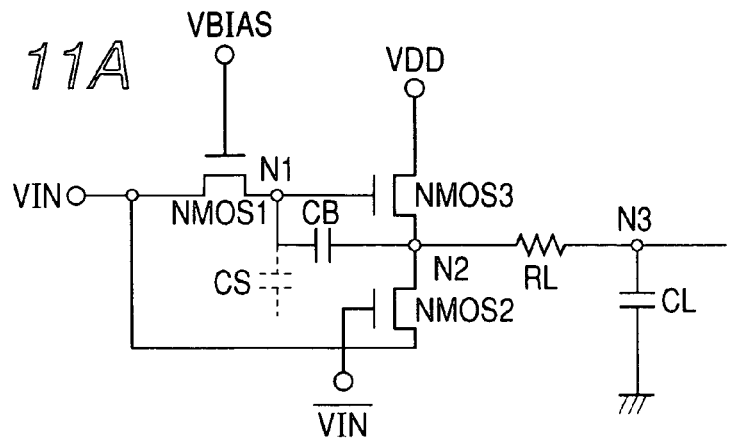
FIG. 11A is a circuit diagram of another embodiment of a voltage level converter fabricated in the liquid crystal display device in accordance with the present invention.

FIG. 11A is a circuit diagram of another embodiment of the voltage level converter VLC fabricated on a surface of a substrate of the liquid crystal display device in accordance with the present invention, and is similar to that of FIG. 10A.

The configuration of FIG. 11A differs from that of FIG. 10A in that the gate terminal of the n-channel type MOS transistor NMOS2 is supplied with a pulse VINinvert equal in magnitude and opposite in phase with respect to the input pulse VIN instead of the fixed voltage VBIAS. In this specification, the suffix "invert" is also used instead of the bar $\overline{()}$ to indicate an inversion.

Figure 11B:
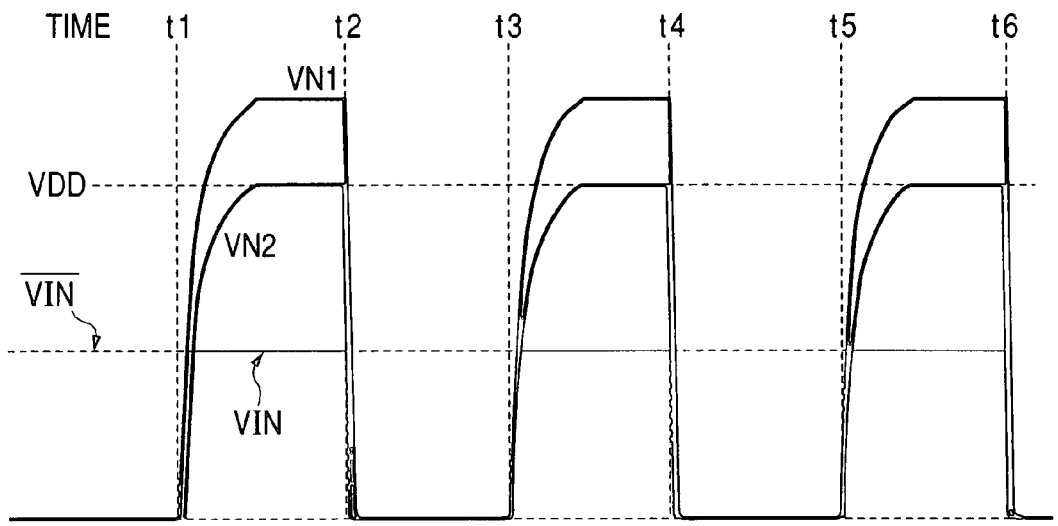
FIG. 11B illustrates waveforms of an input pulse and signals at two nodes in the voltage level converter of FIG. 11A.

The following explains operation of the circuit of FIG. 11A by reference to FIG. 11B.

At time t1, the input pulse VIN changes from "L" to "H", the voltage VN1 at the node N1 rises up to the value expressed by the following equation (42) via NMOS1.

$$VN1 = VH - Vth \quad (42)$$

At this time, since the gate of NMOS2 is supplied with the voltage VINinvert opposite in phase with respect to the input pulse VIN, NMOS2 is turned OFF, and therefore a rise in the voltage VN2 at the node N2 via NMOS2 does not occur.

If the following equation (43) is satisfied, NMOS3 is turned ON, and thereby the voltage VN2 at the node N2 begins to rise.

$$VN1 = VH - Vth \quad (43)$$

For simplicity, the voltage rise at the node N2 is neglected which has been caused through NMOS3 before the voltage VN1 at the node N1 reaches the value expressed by the equation (43). Let ΔV be a voltage rise in the voltage VN2 after this time, and then the voltage VN1 Δ at the node N1 is expressed by the following equation (44).

$$VN1\Delta = VN1 + \Delta V \times CB/(CB+CS) \quad (44)$$
$$= VH - Vth + \Delta V \times CB/(CB+CS)$$

The value of (VN1Δ−VN2) is obtained by subtracting the voltage VN2 at the node N2 represented by ΔV from the voltage VN1Δ expressed by the equation (44), and as far as the following equation (45) is satisfied, NMOS3 maintains the ON state.

$$VN1\Delta - VN2 = VH - Vth + \Delta V \times CB/(CB+CS) - \Delta V > Vth \quad (45)$$

If the following relationship (47) obtained by substituting the following equation (46) in the equation (45) is satisfied, the voltage VN2 at the node N2 rises up to the voltage VDD on the high-voltage power supply line VDD.

$$\Delta V = VDD \quad (46)$$

$$VH - Vth + VDD \times CB/(CB+CS) - VDD > Vth \quad (47)$$

The subsequent operation is the same as that explained in connection with Embodiment 6, and therefore the voltage-level-converted pulses are obtained in this embodiment as shown in FIG. 11B.

Figure 11C:
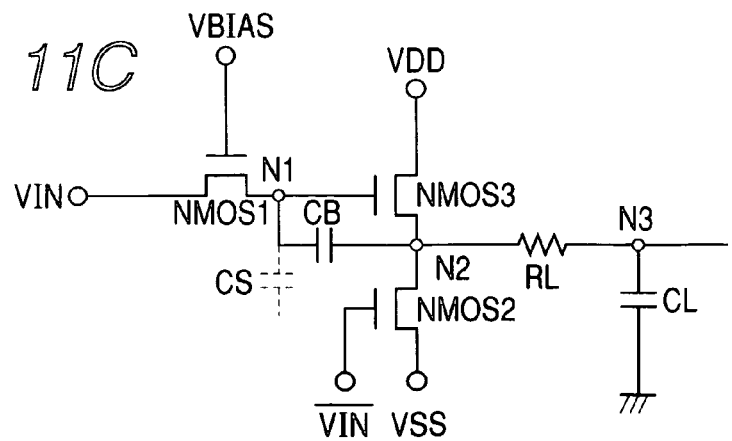
FIG. 11C is a circuit diagram of a modification of the embodiment of FIG. 11A.

As a modification of this embodiment, the first terminal of NMOS2 having VINinvert applied to its gate electrode can be connected to the low-voltage power supply line VSS as shown in FIG. 11C.

Embodiment 8

Figure 12A:
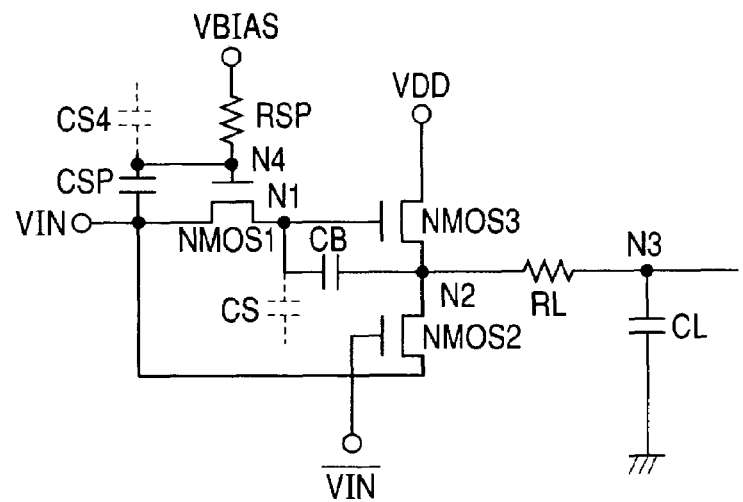
FIG. 12A is a circuit diagram of another embodiment of a voltage level converter fabricated in the liquid crystal display device in accordance with the present invention.

FIG. 12A is a circuit diagram of another embodiment of the voltage level converter VLC fabricated on a surface of a substrate of the liquid crystal display device in accordance with the present invention, and is similar to those of FIGS. 10A and 11A.

The configuration of FIG. 12A from those of FIGS. 10A and 11A in that the gate terminal of the n-channel type MOS transistor NMOS1 is coupled to the fixed voltage VBIAS through a resistor RSP instead of being connecting directly to the fixed voltage VBIAS, and is capacitively coupled to the input terminal for the input pulse VIN through a capacitance CSP.

Figure 12B:
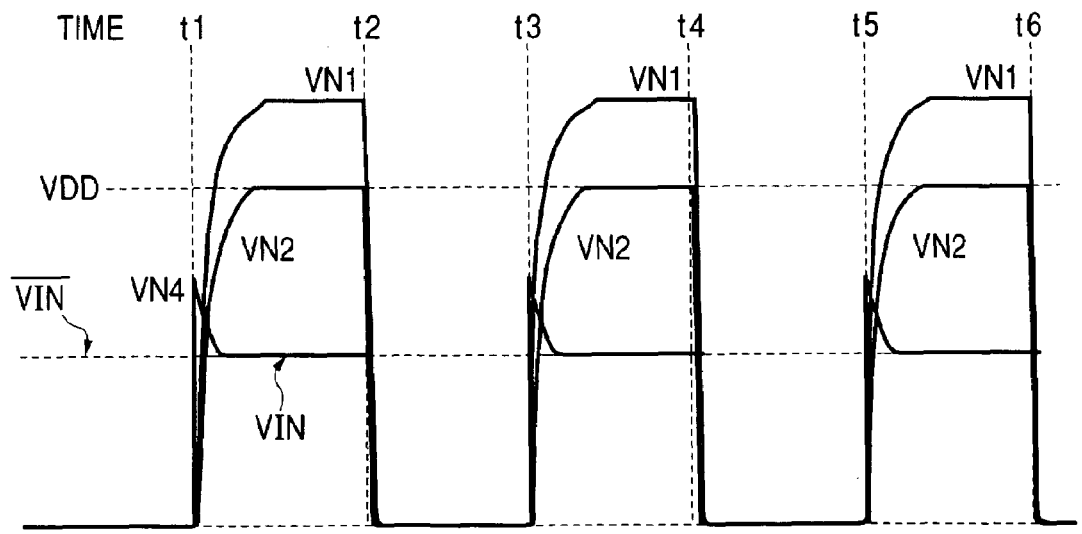
FIG. 12B illustrates waveforms of an input pulse and signals at three nodes in the voltage level converter of FIG. 12A.

The following explains the operation of the circuit of FIG. 12A by reference to FIG. 12B.

When the input pulse VIN changes from "L" to "H" at time t1, this voltage change is transferred to the node N4 through the capacitance CSP, and the voltage change at the node N4, that is, the voltage change at the gate of NMOS1, is approximately expressed by the following equation (48).

$$\Delta V = VH \times CSP/(CSP+CS4) \tag{48}$$

where CS4 represents a parasitic capacitance component which is a capacitance formed at the node N4 minus the capacitance CSP.

The voltage VN4 at the node N4 is expressed by the following equation (49).

$$VN4 = VBIAS + \Delta V \tag{49}$$

After this time, a charge corresponding to a voltage component beyond the voltage VBIAS is discharged toward the bias voltage BIAS through the resistance RSP, and its time constant is approximately expressed by the following equation (50).

$$\tau = RSP \times (CSP+CS4) \tag{50}$$

NMOS is turned ON, the voltage VN1 at the node N1 rises, and when the voltage VN1 rises so high as to satisfy the following equation (51), NMOS1 is cut off and turned OFF.

$$VN4-VN1=Vth \tag{51}$$

Let tcg be time required for the voltage VN1 at the node N1 to reach the value to satisfy the equation (51). Then the voltage VN4 at the node N4 at this time is approximately expressed by the following equation (52).

$$VN4 = VBIAS + \Delta V \times \exp(-tcg/\tau) \tag{52}$$

Anyway, since VN4>VBIAS, even if VBIAS is selected to be VDD/2, the amount of current flowing through NMOS3 is larger (i.e., the on-resistance is smaller) than in the case of Embodiment 7, thereby charging a larger amount of charge into the node N1 before the relationship expressed by the equation (52) is satisfied, and consequently, the voltage VN2 at the node N2 becomes higher than the voltage VN1 expressed by the equation (42) in Embodiment 7.

Furthermore, it is possible to realize the relationship of VN1=VH by selecting CSP and RSP such that the voltage VN4 expressed by the equation (52) satisfies the following equation (53).

$$VN4 = VBIAS + \Delta V \times \exp(-tcg/\tau) \geq Vth \tag{53}$$

For simplicity, it is assumed that VN1=VH, and a voltage rise at the node N2 can be neglected which has been caused by a current flowing through NMOS3 during tcg.

After that, a relationship expressed by the following equation (54) is realized by a voltage rise Δ VN2 of the voltage VN2 at the node N2 caused by charging the node N2 through NMOS3, and the voltage VN1 is higher by the voltage Vth than the voltage expressed by the equation (44) in Embodiment 7.

$$VN1 = VH + \Delta VN2 \times CB/(CB+CS) \tag{54}$$

This means that the gate voltage of NMOS3 is higher than that in Embodiment 7, and as a result the amount of current charging the node N2 through NMOS3 is increased, and thereby the speed of rise of the voltage VN2 is increased.

Consequently, the voltage level conversion can be performed in a shorter period of time, and thereby processing of faster pulses can be realized.

As a modification of this embodiment, the first terminal of NMOS2 having VINinvert applied to its gate electrode can be connected to the low-voltage power supply line VSS as in the case of the modification of Embodiment 7.

Embodiment 9

Figure 13A:
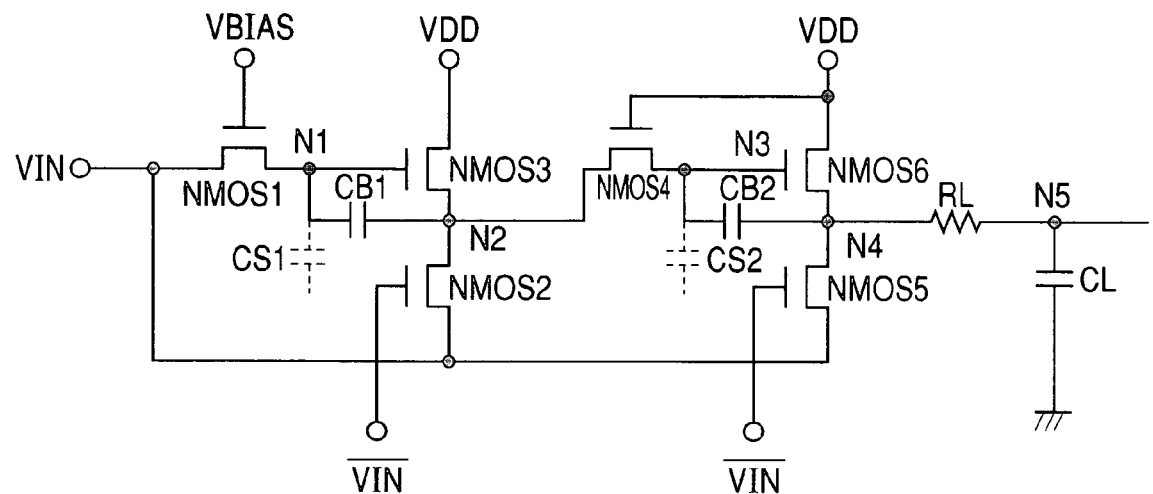
FIG. 13A is a circuit diagram of another embodiment of a voltage level converter fabricated in the liquid crystal display device in accordance with the present invention.

FIG. 13A is a circuit diagram of another embodiment of the voltage level converter VLC fabricated on a surface of a substrate of the liquid crystal display device in accordance with the present invention.

In the configuration of FIG. 13A, two stages each comprising the circuit of FIG. 1A are coupled in cascade, and a gate terminal of a transistor (the n-channel type MOS transistor NMOS4 in FIG. 13A) in the second stage corresponding to the n-channel type MOS transistor NMOS1 in the first stage preceding the second stage is coupled to the high-voltage power supply line VDD. Reference characters CB1 and CB2 represent capacitances corresponding to the capacitance CB in FIG. 11A, and reference characters CS1 and CS2 represent parasitic capacitances at the nodes N1 and N3, respectively. The voltage level converter of this configuration is capable of reducing an effective ON-resistance of the output MOS (the n-channel type MOS transistor NMOS6) and improving the speed of charging the load circuit.

Figure 13B:
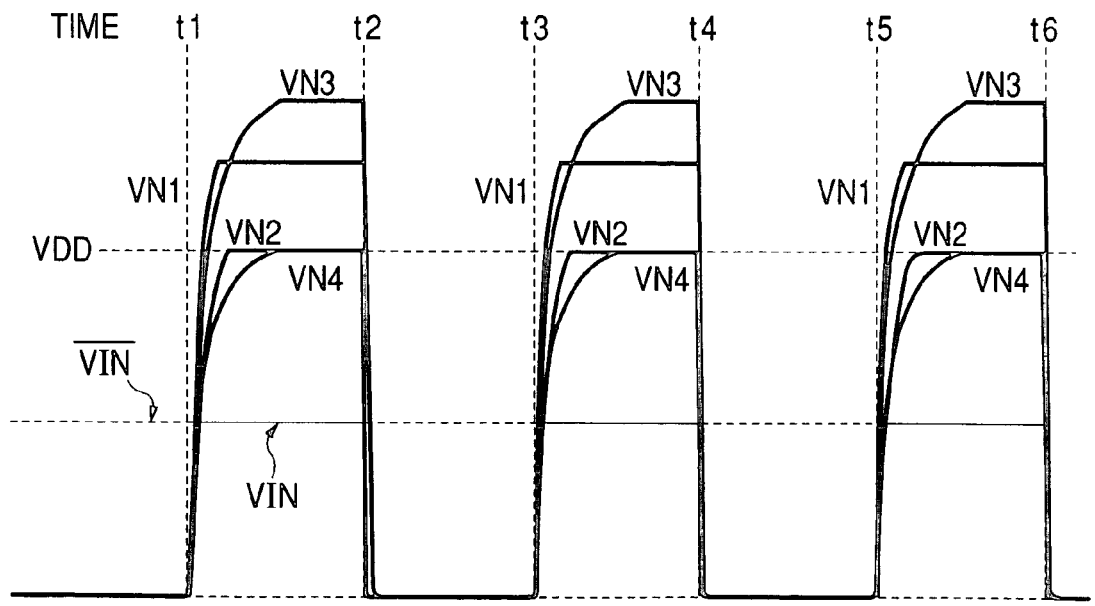
FIG. 13B illustrates waveforms of an input pulse and signals at four nodes in the voltage level converter of FIG. 13A.

FIG. 13B is a timing chart for explaining the operation of the above-described circuit, FIG. 13C illustrates changes of the voltages at the nodes N1 and N2 of FIG. 13A in greater detail, and FIG. 13D illustrates changes of the voltages at the nodes N3 and N4 of FIG. 13A in greater detail.

When the input pulse VIN changes from "L" to "H" at time t1, the node N1 begins to be charged and the voltage VN1 at the node N1 rises. Then when the voltage VN1 rises up to the threshold voltage Vth of NMOS3, NMOS3 is turned ON and the voltage VN2 at the node N2 begins to rise.

When the voltage VN1 becomes (VBIAS−Vth), NMOS is turned OFF and its electrical connection to the input terminal for the input pulse VIN is cut off. Let V1 be the voltage VN2 at the node N2 at this time.

As in the above explanation, let ΔV1 be (VBIAS−Vth−V1). Then if ΔV1>Vth, NMOS3 maintains the ON state, and if the following equation (55) is satisfied, the voltage VN2 at the node N2 rises up to VDD.

$$VBIAS-Vth+(VDD-V1) \times (CB1/(CB1+CS1))- \\ VDD \geq Vth \tag{55}$$

Here, the time constant for the speed of the voltage rise is approximately expressed by the following equation (56).

$$\tau(t) = RON(t)(NMOS3) \times (CB2+CS2) \tag{56}$$

where RON(t)(NMOS3) represents an ON-resistance of NMOS3.

Here, since an effective current through NMOS3, that is, its ON-resistance RON(t)(NMOS3), varies with time, the time constant τ(t) is a function of time.

A current Ids through NMOS3 at time t2 is approximately expressed by the following equation (57).

$$Ids = A \times (\Delta V1 - Vth) \times (\Delta V1 - Vth) \quad (57)$$

where A is a constant determined by the structure, dimensions and others of the MOS transistor.

Since the ON-resistance RON(t)(NMOS3)∝/Ids, it is apparent that ΔV1 is an important factor in determining the time constant τ(t) by the equation (56). That is to say, the larger the voltage ΔV1 is selected to be, the smaller the ON-resistance RON(t)(NMOS3) becomes, and consequently, the time constant τ(t) is reduced and the speed of the voltage rise in the load circuit is increased.

In this embodiment, in the first stage composed of NMOS1, NMOS2 and NMOS3, "H" of the input pulse VIN is raised to the voltage VDD, and then is supplied as an input voltage to the succeeding stage comprised of NMOS4, NMOS5 and NMOS6. The gate of NMOS4 is coupled to the high-voltage power supply line VDD, and therefore the turn-off voltage of NMOS4 becomes (VDD–Vth).

The source of NMOS6 serves as an output terminal of this embodiment and is coupled to the load circuit, and as a result its initial voltage rise becomes slow. Therefore, it is easy to set such that ΔV2 indicated in FIG. 13D is made larger than ΔV1, and consequently, the ON-resistance becomes smaller and thereby the speed of rise of the voltage VN4 at the node N4 is increased.

As a modification of this embodiment, the first terminals of NMOS2 and NMOS5 having VINinvert applied to their respective gate electrodes can be connected to the low-voltage power supply line VSS as in the case of Embodiment 7.

Embodiment 10

Figure 14A:
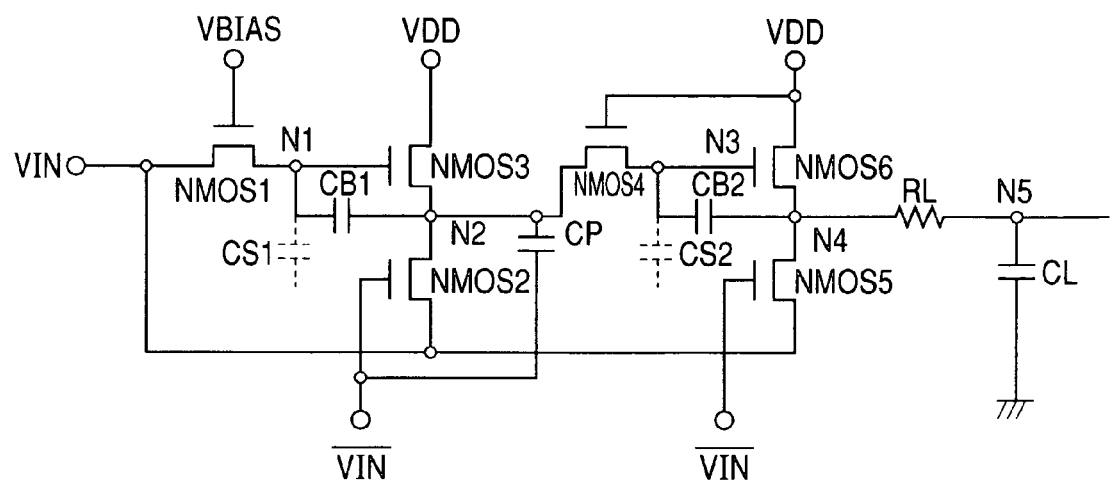
FIG. 14A is a circuit diagram of another embodiment of a voltage level converter fabricated in the liquid crystal display device in accordance with the present invention.

FIG. 14A is a circuit diagram of another embodiment of the voltage level converter VLC fabricated on a surface of a substrate of the liquid crystal display device in accordance with the present invention, and is similar to that of FIG. 13A.

The configuration of FIG. 14A differs from that of FIG. 13A in that a capacitance CP is coupled between the gate terminal and the second terminal of the n-channel type MOS transistor NMOS2.

The voltage VN2 at the node N2 decreases because of the coupling capacitance CP when the input pulse VIN changes from "H" to "L". Since the voltage VN2 at the node N2 is lower than "L" of the input pulse VIN when NMOS3 is in the ON state, the voltage VN1 at the node N1 becomes (VBIAS–Vth), and the voltage VN2 at the node N2 at the time when NMOS1 is turned OFF is lower than that in Embodiment 9.

Therefore, ΔV1 becomes larger than that in Embodiment 9, and as a result the speeds of rise of the voltages VN2 and VN4 at the nodes N2 and N4 are increased and their rise times are improved. Consequently, the voltage level conversion of pulses of higher frequencies can be realized.

Figure 14B:
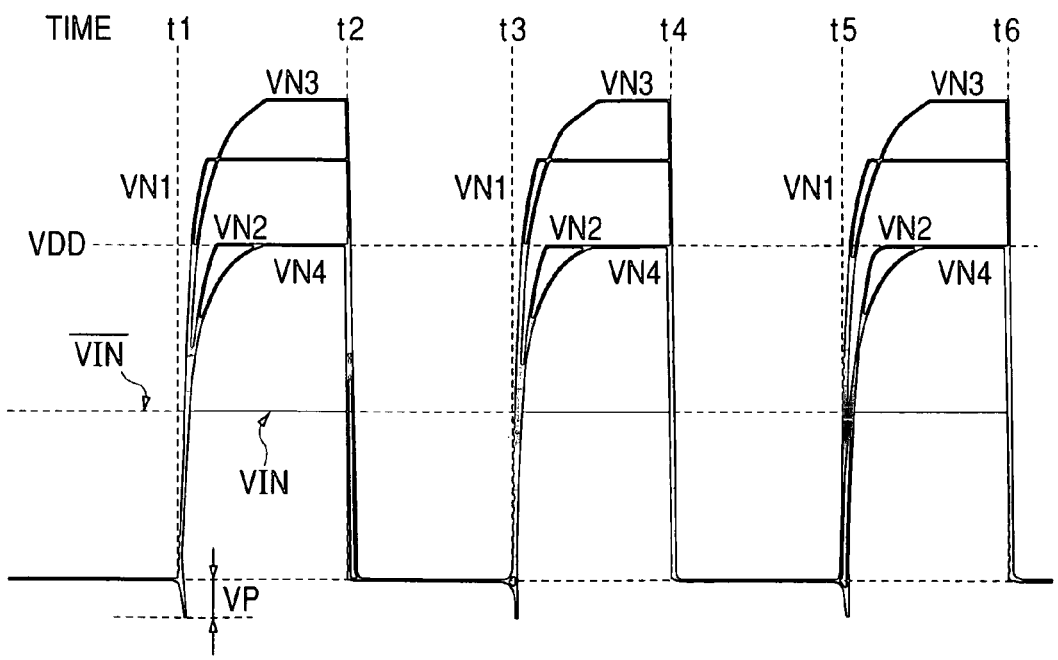
FIG. 14B illustrates waveforms of an input pulse and signals at four nodes in the voltage level converter of FIG. 14A.
Figure 14D:
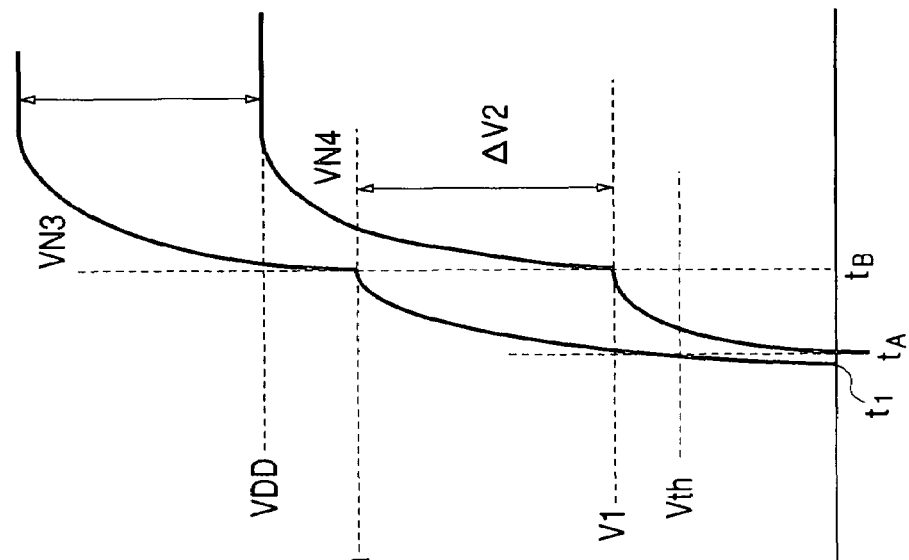
FIG. 14D illustrates changes of the potentials at the nodes N3 and N4 of FIG. 14A in greater detail.
Figure 14C:
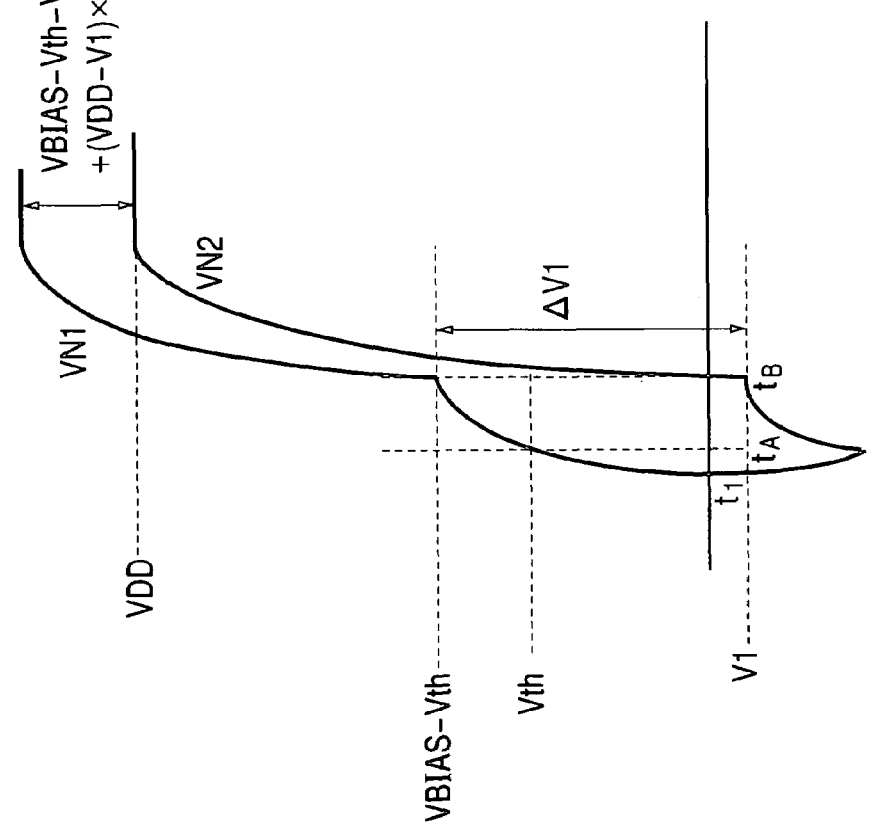
FIG. 14C illustrates changes of the potentials at the nodes N1 and N2 of FIG. 14A in greater detail.

FIG. 14B is a timing chart for explaining the operation of the above-described circuit, FIG. 14C illustrates changes of the voltages at the nodes N1 and N2 of FIG. 14A in greater detail, and FIG. 14D illustrates changes of the voltages at the nodes N3 and N4 of FIG. 14A in greater detail.

As a modification of this embodiment, the first terminals of NMOS2 and NMOS5 having VINinvert applied to their respective gate electrodes can be connected to the low-voltage power supply line VSS as in the case of Embodiment 7.

Embodiment 11

Figure 15A:
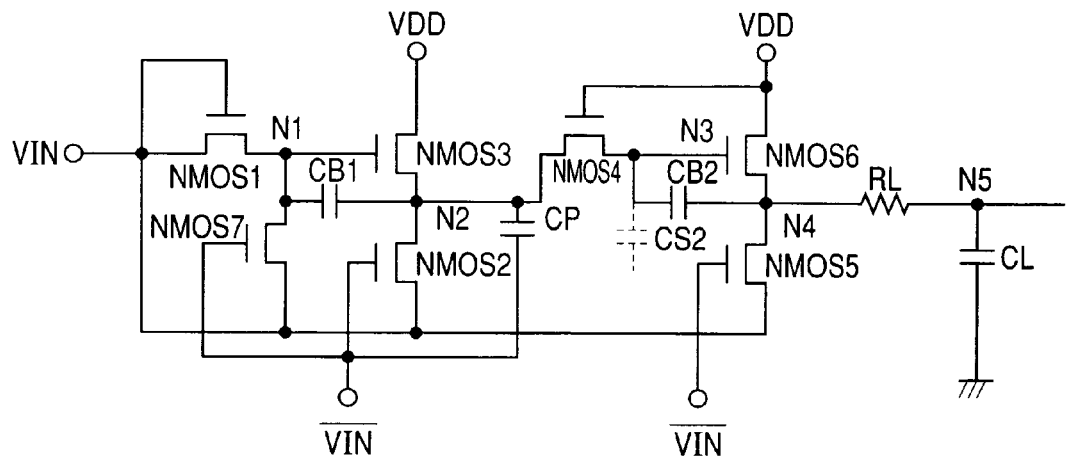
FIG. 15A is a circuit diagram of another embodiment of a voltage level converter fabricated in the liquid crystal display device in accordance with the present invention.

FIG. 15A is a circuit diagram of another embodiment of the voltage level converter VLC fabricated on a surface of a substrate of the liquid crystal display device in accordance with the present invention, and is similar to that of FIG. 14A.

The configuration of FIG. 15A differs from that of FIG. 14A in that the input pulse VIN is supplied to the gate electrode of the n-channel type MOS transistor NMOS1 also, and another n-channel type MOS transistor NMOS7 is added. A second terminal of NMOS7 is coupled to a junction point between the second terminal of the n-channel type MOS transistor NMOS1 and the first terminal of the capacitance CB1, a first terminal of MOS7 is coupled to the input terminal for the input pulse VIN, and a gate terminal of NMOS7 is supplied with the pulse VINinvert equal in magnitude and opposite in phase with respect to the input pulse VIN.

The voltage level converter of this configuration provides the same advantages as in the case of Embodiment 10, and eliminates the need for the controlling bias voltage VBIAS described in connection with Embodiment 10.

Figure 15B:
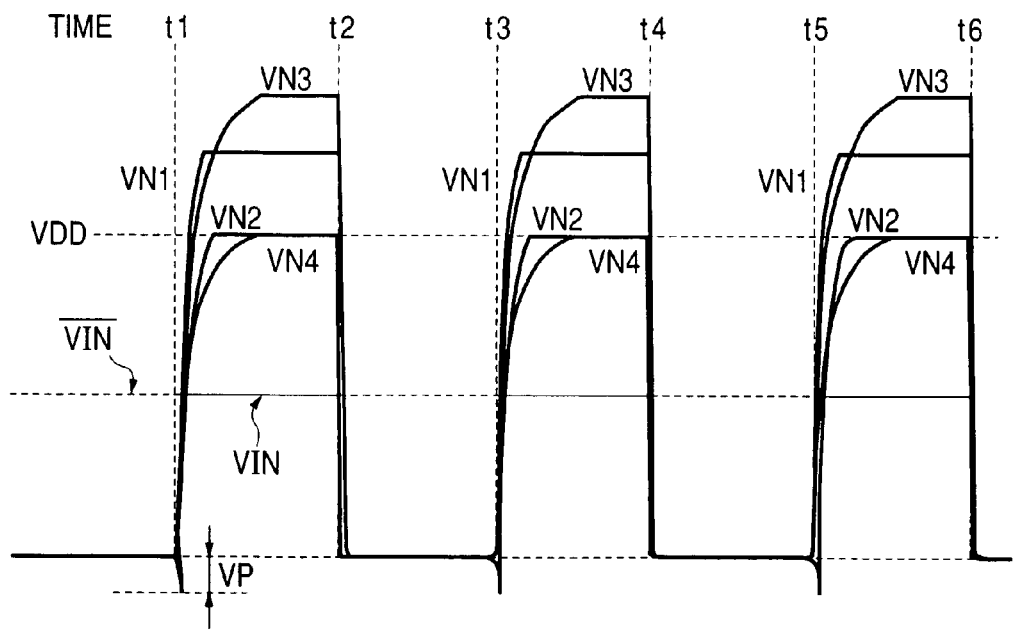
FIG. 15B illustrates waveforms of an input pulse and signals at four nodes in the voltage level converter of FIG. 15A.
Figure 15D:
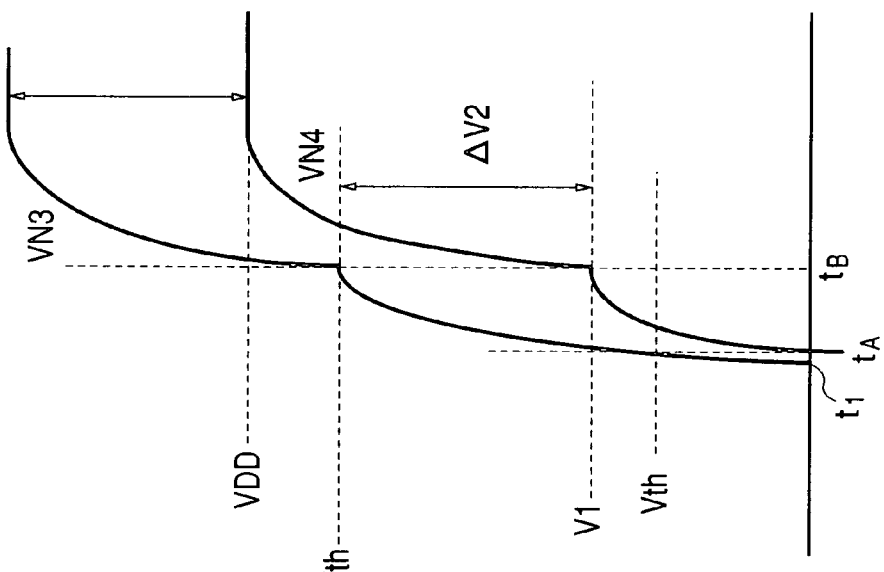
FIG. 15D illustrates changes of the potentials at the nodes N3 and N4 of FIG. 15A in greater detail.
Figure 15C:
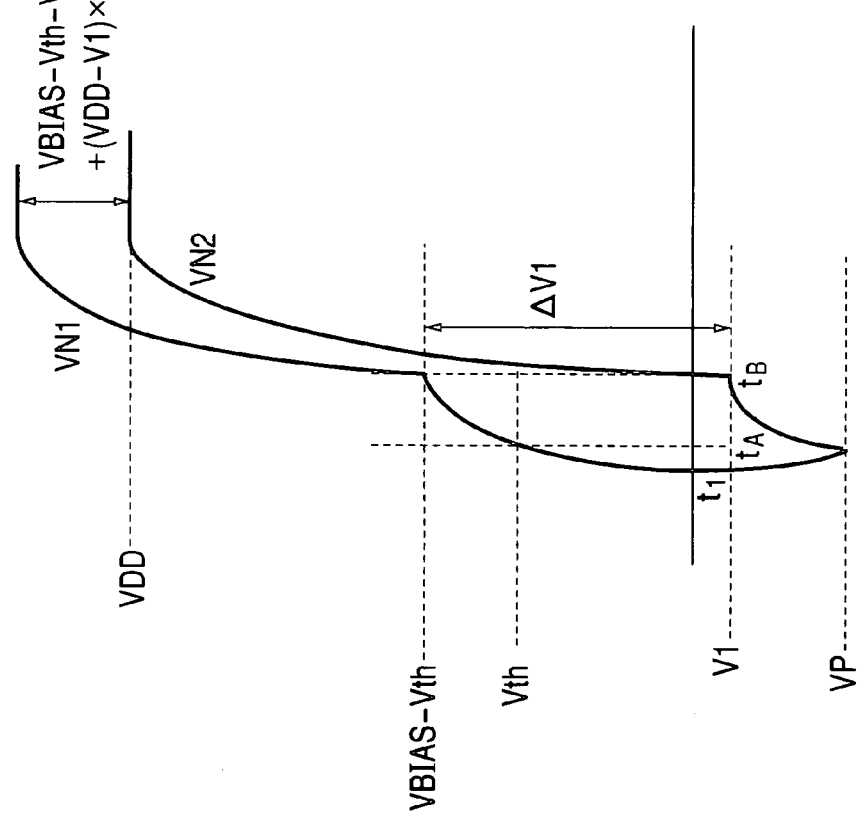
FIG. 15C illustrates changes of the potentials at the nodes N1 and N2 of FIG. 15A in greater detail.
Figure 16:
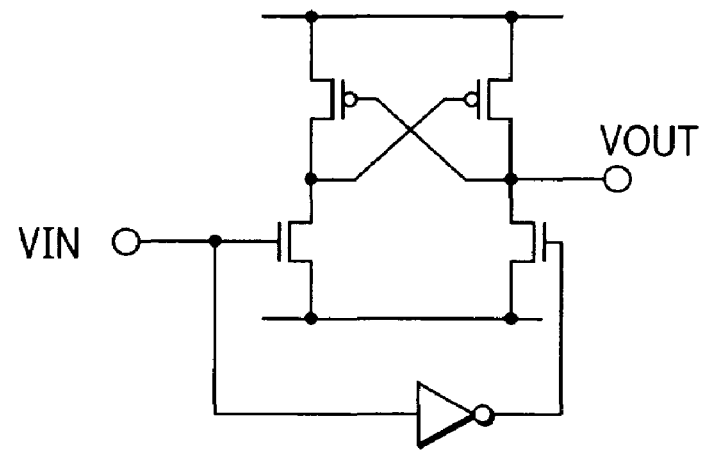
FIG. 16 is a circuit diagram of an example of a general conventional voltage level converter.
Figure 17:
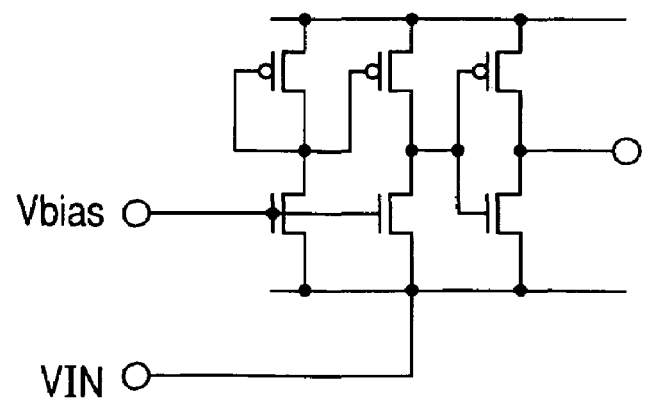
FIG. 17 is a circuit diagram of another example of a general conventional voltage level converter.

FIG. 15B is a timing chart for explaining the operation of the above-described circuit, FIG. 15C illustrates changes of the voltages at the nodes N1 and N2 of FIG. 15A in greater detail, and FIG. 15D illustrates changes of the voltages at the nodes N3 and N4 of FIG. 15A in greater detail.

As a modification of this embodiment, the first terminals of NMOS2, NMOS5 and NMOS7 having VINinvert applied to their respective gate electrodes can be connected to the low-voltage power supply line VSS as in the case of Embodiment 7.

Embodiments 6 to 11 have been explained by using n-channel type MOS transistors only for all of thin film transistors constituting the circuits, but it is needless to say that the n-channel type MOS transistor can be replaced by p-channel type MOS transistors with the high-voltage power supply and the low-voltage power supply, and the same advantages of the voltage level converters.

In the above-explained embodiments, the transistors constituting the respective voltage level converters are MOS transistors using $SiO_2$ layers, for example, as their gate insulating films, but it is needless to say that they can be replaced by MIS transistors using other insulating films such as silicon nitride layers, for example, as their gate insulating films.

As is apparent from the above explanations, the present invention provides the display device provided with a voltage level converter having a through-current sufficiently suppressed.

What is claimed is:

1. A display device including a plurality of pixels and a driver circuit to drive said plurality of pixels, said driver circuit including a level converter circuit formed on an insulating substrate and comprised of MISTFTs (Metal Insulator Semiconductor Thin Film Transistors) of a same conductivity type and having semiconductor layers comprised of polysilicon, said level converter circuit comprising a first MISTFT, a second MISTFT, and a third MISTFT, a first terminal of said first MISTFT being coupled to an input terminal for receiving an input pulse, a gate terminal of said first MISTFT being coupled to a fixed-voltage power supply line, a first terminal of said second MISTFT being coupled to a low-voltage power supply line, a gate terminal of said second MISTFT being supplied with a pulse equal in magnitude and opposite in phase with respect to said input pulse, a second terminal of said first MISTFT being coupled to a gate terminal of said third MISTFT and a first terminal of a capacitor, a first terminal of said third MISTFT being coupled to a high-voltage power supply line, and a junction point of a second terminal of said second MISTFT, a second terminal of said third MISTFT, and a second terminal of said capacitor being coupled to an output terminal of said level converter circuit, wherein a voltage on said fixed-voltage power supply line is lower than a voltage on said high-voltage power supply line.

2. A display device according to claim 1, wherein said gate terminal of said first MISTFT is coupled to said fixed-voltage power supply line via a resistor, and is also coupled to said input terminal via a capacitor.

3. A display device including a plurality of pixels and a driver circuit to drive said plurality of pixels, said driver circuit including a level converter circuit formed on an insulating substrate and comprised of MISTFTs (Metal Insulator Semiconductor Thin Film Transistors) of a same conductivity type and having semiconductor layers comprised of polysilicon, said level converter circuit having a plurality of stages arranged in series each of said plurality of stages comprising:

a first MISTFT, a second MISTFT, and a third MISTFT, a first terminal of said first MISTFT being coupled to an input terminal for receiving an input pulse, a gate terminal of said first MISTFT being coupled to a fixed-voltage power supply line, a first terminal of said second MISTFT being coupled to a low-voltage power supply line, a gate terminal of said second MISTFT being supplied with a pulse equal in magnitude and opposite in phase with respect to said input pulse, a second terminal of said first MISTFT being coupled to a gate terminal of said third MISTFT and a first terminal of a capacitor, a first terminal of said third MISTFT being coupled to a high-voltage power supply line, and a junction point of a second terminal of said second MISTFT, a second terminal of said third MISTFT, and a second terminal of said capacitor being coupled to an output terminal, wherein a voltage on said fixed-voltage power supply line is lower than a voltage on said high-voltage power supply line.

4. A display device according to claim 3, wherein said gate terminal of said first MISTFT in at least one of said plurality of stages is disconnected from said fixed-voltage power supply line, and is coupled to said high-voltage power supply line.

5. A display device according to claim 4, wherein said gate terminal and said second terminal of said second MISTFT in at least one of said plurality of stages is coupled together via a capacitor.

6. A display device according to claim 3, wherein said gate terminal and said second terminal of said second MISTFT in at least one of said plurality of stages is coupled together via a capacitor.

7. A display device according to claim 3, wherein said gate terminal of said first MISTFT in a first stage in order of said plurality of stages is disconnected from said fixed-voltage power supply line, and is coupled to said input terminal of said first stage.

8. A display device including a plurality of pixels and a driver circuit to drive said plurality of pixels, said driver circuit including a level converter circuit formed on an insulating substrate and comprised of MISTFTs (Metal Insulator Semiconductor Thin Film Transistors) of a same conductivity type and having semiconductor layers comprised of polysilicon, said level converter circuit having first and second stages arranged in series in the order named, wherein said first stage comprises a first MISTFT, a second MISTFT, a third MISTFT, a seventh MISTFT, a first capacitor, and a third capacitor, wherein:

a first terminal and a gate terminal of said first MISTFT are coupled to an input terminal of said first stage for receiving an input pulse, first terminals of said second MISTFT and said seventh MISTFT are coupled to said input terminal, gate terminals of said second MISTFT and said seventh MISTFT are supplied with a pulse equal in magnitude and opposite in phase with respect to said input pulse, second terminals of said first MISTFT and said seventh MISTFT are coupled to a gate terminal of said third MISTFT and a first terminal of said first capacitor, a first terminal of said third MISTFT is coupled to a high-voltage power supply line, a junction point of second terminals of said second MISTFT and said third MISTFT and a second terminal of said first capacitor are coupled to an output terminal of said first stage, and said third capacitor is coupled between said gate terminal of said seventh MISTFT and said output terminal of said first stage; and wherein said second stage comprises a fourth MISTFT, a fifth MISTFT, a sixth MISTFT, and a second capacitor, wherein:

a first terminal of said fourth MISTFT is coupled to said output terminal of said first stage, a first terminal of said fifth MISTFT is coupled to said input terminal of said first stage, a gate terminal of said fifth MISTFT is supplied with said pulse equal in magnitude and opposite in phase with respect to said input pulse, a second terminal of said fourth MISTFT is coupled to a gate terminal of said sixth MISTFT and a first terminal of said second capacitor, a first terminal of said sixth MISTFT and a gate terminal of said fourth MISTFT are coupled to a high-voltage power supply line, and a junction point of second terminals of said fifth MISTFT and said sixth MISTFT and a second terminal of said second capacitor are coupled to an output terminal of said second stage.

9. A display device including a plurality of pixels and a driver circuit to drive said plurality of pixels, said driver circuit including a level converter circuit formed on an insulating substrate and comprised of MISTFTs (Metal Insulator Semiconductor Thin Film Transistors) of a same conductivity type and having semiconductor layers comprised of polysilicon, said level converter circuit having first and second stages arranged in series in the order named, wherein said first stage comprises a first MISTFT, a second MISTFT, a third MISTFT , a seventh MISTFT, a first capacitor, and a third capacitor, wherein:

a first terminal and a gate terminal of said first MISTFT are coupled to an input terminal of said first stage for receiving an input pulse, first terminals of said second MISTFT and said seventh MISTFT are coupled to a low-voltage power supply line, gate terminals of said second MISTFT and said seventh MISTFT are supplied with a pulse equal in magnitude and opposite in phase with respect to said input pulse, second terminals of said first MISTFT and said seventh MISTFT are coupled to a gate terminal of said third MISTFT and a first terminal of said first capacitor, a first terminal of said third MISTFT is coupled to a high-voltage power supply line, a junction point of second terminals of said second MISTFT and said third MISTFT and a second terminal of said first capacitor are coupled to an output terminal of said first stage, and said third capacitor is coupled between said gate terminal of said seventh MISTFT and said output terminal of said first stage; and wherein said second stage comprises a fourth MISTFT, a fifth MISTFT, a sixth MISTFT, and a second capacitor, wherein:

a first terminal of said fourth MISTFT is coupled to said output terminal of said first stage, a first terminal of said fifth MISTFT is coupled to said low-voltage power supply line, a gate terminal of said fifth MISTFT is supplied with said pulse equal in magnitude and opposite in phase with respect to said input pulse, a second terminal of said fourth MISTFT is coupled to a gate terminal of said sixth MISTFT and a first terminal of said second capacitor, a first terminal of said sixth MISTFT and a gate terminal of said fourth MISTFT are coupled to a high-voltage power supply line, and a junction point of second terminals of said fifth MISTFT and said sixth MISTFT and a second terminal of said second capacitor are coupled to an output terminal of said second stage.

* * * * *